United States Patent [19]
Ota

[11] Patent Number: 5,602,644
[45] Date of Patent: Feb. 11, 1997

[54] ALIGNMENT APPARATUS UTILIZING A PLURALITY OF WAVELENGTHS

[75] Inventor: Kazuya Ota, Tokyo, Japan

[73] Assignee: Nikon Corporation, Tokyo, Japan

[21] Appl. No.: 548,626

[22] Filed: Oct. 26, 1995

[30] Foreign Application Priority Data

Oct. 27, 1994 [JP] Japan ................................. 6-263354
Apr. 25, 1995 [JP] Japan ................................. 7-99207

[51] Int. Cl.⁶ ................................................ G01B 9/02
[52] U.S. Cl. ............................ 356/363; 356/349; 250/548
[58] Field of Search .................................. 356/345, 349, 356/363, 401; 250/548

[56] References Cited

U.S. PATENT DOCUMENTS 5,171,999  12/1992  Komatsu et al. .
5,347,356   9/1994  Ota et al. ................................. 356/349
5,530,256   6/1996  Mizutani et al. ........................ 356/349
5,530,257   6/1996  Mizutani et al. ........................ 356/349

*Primary Examiner*—Frank Gonzalez
*Assistant Examiner*—Robert Kim
*Attorney, Agent, or Firm*—Armstrong, Westerman, Hattori, McLeland & Naughton

[57] ABSTRACT

Two-colored illumination light emitted from first and second laser beam sources illuminates a reticle mark and a wafer mark. Diffraction light from the reticle mark and the wafer mark is received by two photoelectric detection elements, respectively. The one photoelectric element receives single-colored diffraction light from light of the first light source through a color filter to generate a reticle beat signal. The other photoelectric element receives two-colored light to generate a wafer beat signal. A phase difference between the reticle beat signal and the wafer beat signal when shutting off the second laser beam source is aligned with a phase difference between the two signals produced when turning on the second laser beam source and decreasing the power of the first laser light source.

15 Claims, 12 Drawing Sheets

Fig. 2(a)
Fig. 2(b)
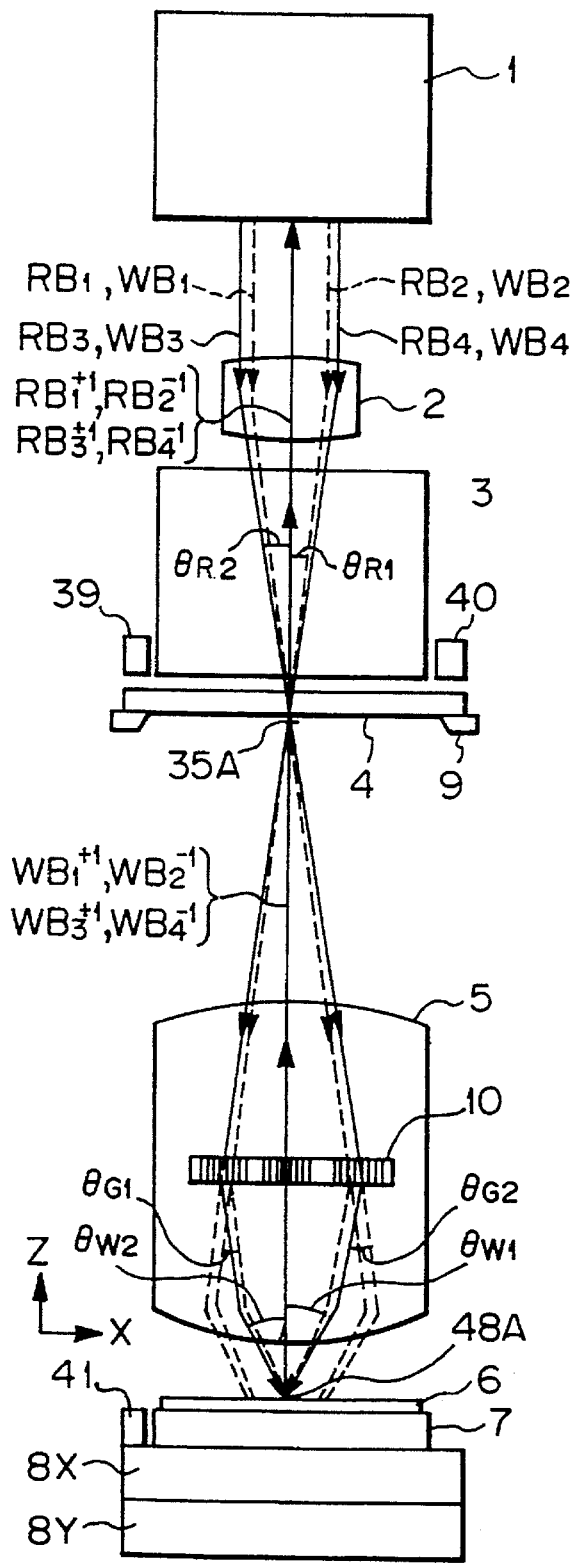
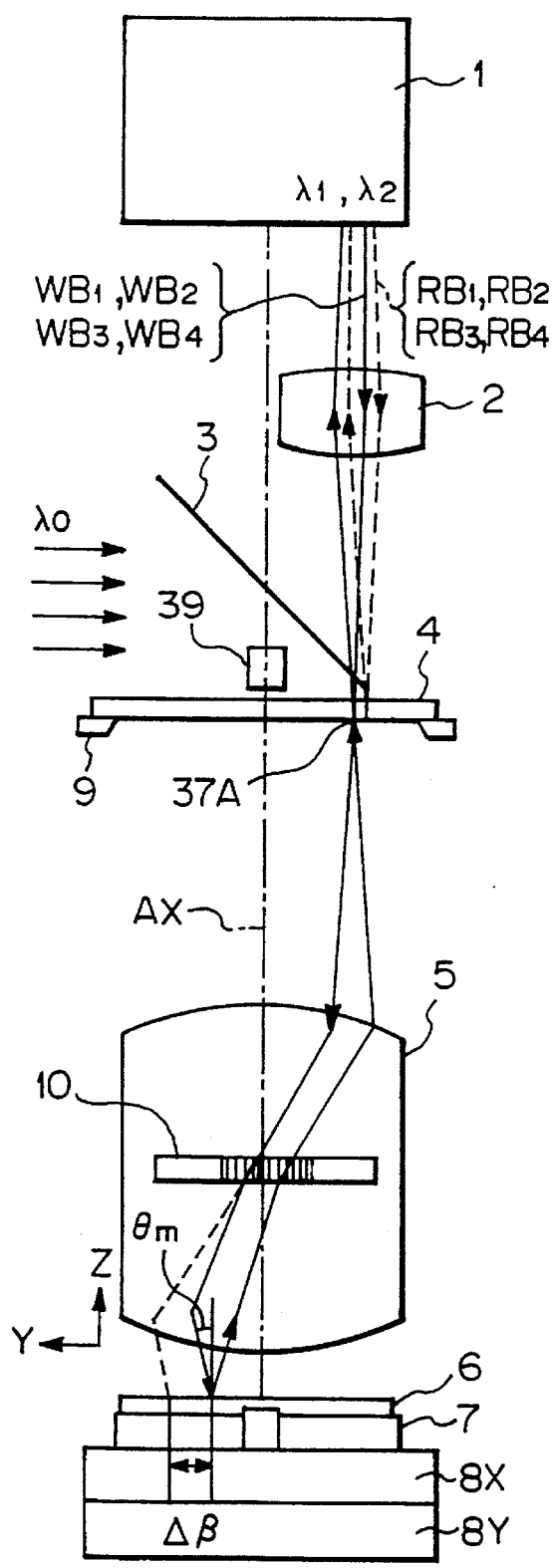

ALIGNMENT APPARATUS UTILIZING A PLURALITY OF WAVELENGTHS

BACKGROUND OF THE INVENTION

1. Field of the Invention

The present invention relates to an alignment apparatus used for a projection exposure apparatus including a projection optical system for transferring a pattern formed on a mask to a photosensitive substrate, and more particularly to an alignment apparatus of a heterodyne interference method for relative alignment of a mask with a photosensitive substrate by emitting alignment light having a plurality of wavelengths to the photosensitive substrate.

2. Related Background Art

In a projection exposure apparatus used for producing semiconductors, liquid crystal display elements, and so on, multilayer circuit patterns are formed on a wafer (or a glass plate, etc.). It is necessary for the multilayer circuit patterns to register with each other with high accuracy. In this case, it is very important to align a reticle (or a photo mask and the like) with the wafer with high accuracy, particularly when a pattern formed on the reticle is to be transferred to a second or subsequent layer on the wafer. Therefore an alignment system is necessary for detecting the relation between a reticle position and a wafer position with high accuracy. Thus, there have been used an alignment system of a TTL (Through-The-Lens) type for detecting a relatively positional relation between the reticle and the wafer through a projection optical system.

It is necessary to use light having a different wavelength from exposure light as alignment light for use in an alignment system in order not to expose a photoresist coated on the wafer.

However, employment of alignment light having a wavelength different from a wavelength of exposure light causes chromatic aberration in projection optical systems. U.S. Pat. Nos. 5,100,237 and 4,492,459 propose ideas to solve the problem of chromatic aberration.

In a process disclosed in U.S. Pat. No. 5,100,237, arrangement of a chromatic aberration correcting lens about an optical axis of a projection optical system at an entrance pupil position enables the chromatic aberration between the wavelength of exposure light and that of alignment light to be corrected, thereby detecting (±) primary diffracted light beams from a wafer mark to perform an alignment between a reticle and a wafer.

In a process disclosed in U.S. Pat. No. 4,492,459, arrangement of a correcting optical system outside or inside an exposure optical path between a reticle and a projection optical system enables chromatic aberration caused by alignment light passing through a projection optical system to be corrected. A reticle mark image and a wafer mark image formed on a wafer are detected through the projection optical system before performing an alignment.

The applicant of this application has proposed an alignment apparatus of a heterodyne interference method with respect to correction of chromatic aberration relative to alignment light. In the alignment apparatus of a heterodyne interference method, arrangement of chromatic aberration controlling members such as phase gratings to a position adjacent to a pupil plane of a projection optical system permits alignment light to be deflected, thereby performing alignment of a reticle and a wafer with each other with high accuracy.

In addition to the problem of the chromatic aberration, since detection of a position of a wafer mark by a monochromatic light weakens a reflected light depending on a photoresist thickness, unevenness of a wafer mark, and so on, it is often difficult to detect the wafer mark. Therefore, the applicant of this application also has proposed an apparatus in which light beams having a plurality of wavelengths (colors) are used as alignment light beams and phase gratings for chromatic aberration are arranged relative to the light beams of wavelengths, respectively to thereby perform alignment with more high accuracy.

As mentioned above, according to the apparatus in which light having a plurality of wavelengths is employed as alignment light and the phase gratings are arranged adjacent to a pupil plane of a projection optical system and in facing relation to the pupil plane, since chromatic aberration by the projection optical system itself offsets that by the phase gratings disposed adjacent to the pupil plane of the projection optical system, resulting chromatic aberration is negligible in a plurality of wavelengths of alignment light. Strictly speaking, however, since some chromatic aberration remains, plurally colored interference fringes can not be aligned with each other simultaneously and precisely on both the reticle and the wafer.

Movement of a viewing system (or a microscope) of an alignment apparatus within an exposure area causes an amount of deviation between plurally colored interference fringes relative to the alignment light having a plurality of the wavelengths to be changed because of the characteristics of a projection optical system. Multilayer circuit patterns are transferred to a wafer by exposing it. Each of the transferred multiple layers has a different reflectance with respect to a wavelength. For example, a layer does not greatly reflect light having one wavelength, another layer does not reflect light having another wavelength. In this case, changing the amount of deviation between the two-colored interference fringes as mentioned above causes an alignment detecting position to be deviated by the change of the amount of deviation between the two-colored interference fringes in comparison with a layer uniformly reflecting the two light beams having the difference wave-lengths. In order to solve the problem, a process (or a contrast method) can be used for adjusting an optical system to maximize a contrast of a beat signal (or a wafer signal) obtained from a wafer mark to decrease the deviation between the two-colored interference fringes. However, it is necessary for the amount of deviation between the two-colored interference fringes to be controlled within a range of from several "nm" to several tens "nm" in order to restrict the deviation therebetween to the extent that it can be made negligible. Thus, the contrast method is not sufficient.

Even if deviation between the two-colored interference fringes relative to the two-colored light on the wafer is adjusted to be decreased, adjustment thereof automatically causes deviation between the two-colored interference fringes to be generated on a reticle. For example, when a ratio of light quantity of the two-colored, light is 1:1 and the one-colored interference fringe is deviated from the other colored interference fringe by a half pitch, a beat signal (or a reticle signal) is not generated from a reticle mark.

SUMMARY OF THE INVENTION:

An object of the present invention is to provide an alignment apparatus of a heterodyne interference method in which deviation between the two-colored interference fringes relative to alignment light of two wavelengths can be measured and adjusted with high accuracy, and in which a reticle signal does not receive any influence by adjusting the deviation between the two-colored interference fringes on a wafer.

The present invention provides an alignment apparatus adapted to be provided on a projection exposure apparatus for projecting through a projection optical system a transferring pattern on a mask onto a photosensitive substrate rested on a two-dimensionally movable stage and for detecting a position of the substrate on the basis of a diffraction grating-shaped mark formed on the substrate comprising:

a reference optical member;

a first illumination optical system for illuminating the reference optical member with a first pair of light beams having different frequencies and a first wavelength;

a first photoelectric detection device for photoelectrically transforming a first heterodyne beam generated by diffraction of the first light beams by the reference optical member into a first beat signal;

a second illumination optical system for illuminating the diffraction grating-shaped mark through the projection optical system with a second pair of light beams having different frequencies and the first wavelength;

a third illumination optical system for illuminating the diffraction grating-shaped mark through the projection optical system with a third pair of light beams having different frequencies and a second wavelength different from the first wavelength;

a second photoelectric detection device for photoelectrically transforming second and third heterodyne beams respectively generated by diffraction of the second and third light beams by the diffraction grating-shaped mark into a second beat signal, the second and heterodyne beam having the first wavelength, the third heterodyne beam having the second wavelength, the second and third heterodyne beams being returned through the projection optical system;

a phase comparing device for detecting a phase difference between the first and second beat signals;

a relative position adjusting device for adjusting a relative position in a diffraction grating-shaped mark measuring direction between a position on the diffraction grating-shaped mark illuminated by the second light beams and that thereon illuminated by the third light beams; and a control device for controlling the relative position adjusting device on the basis of a first phase difference detected by the phase comparing device when light intensity of the third light beams on the substrate is decreased below a predetermined level and a second phase difference detected by the phase comparing device when light intensity of the first light beams on the reference optical member is decreased within the range in which the second heterodyne beam can be detected.

In one preferred embodiment, the reference optical member is formed on the mask, and the reference optical member includes a diffraction grating-shaped mark.

In another preferred embodiment, an illumination light controlling element for controlling chromatic aberration of the projection optical system relative to the light beams of the first wavelength so that the chromatic aberration thereof becomes a predetermined value is provided in an area on one of a Fourier transform plane relative to the mask in the projection optical system and a plane adjacent to the Fourier transform plane through which the light beams of the first wavelength pass, and another illumination light controlling element for controlling chromatic aberration of the projection optical system relative to the light beams of the second wavelength so that the chromatic aberration thereof becomes a predetermined value is provided in an area on one of a Fourier transform plane relative to the mask in the projection optical system and a plane adjacent to the Fourier transform plane through which the light beams of the second wavelength pass.

The present invention also provides a method for detecting a position of a substrate onto which a transferring pattern on a mask is projected through a projection optical system on the basis of a diffraction grating-shaped mark formed on the substrate comprising:

providing a reference optical member;

illuminating the reference optical member with a first pair of light beams having different frequencies and a first wavelength;

photoelectrically transforming a first heterodyne beam generated by diffraction of the first light beams by the reference optical member into a first beat signal;

illuminating the diffraction grating-shaped mark through the projection optical system with a second pair of light beams having different frequencies and the first wavelength;

illuminating the diffraction grating-shaped mark through the projection optical system with a third pair of light beams having different frequencies and a second wavelength different from the first wavelength;

photoelectrically transforming second and third heterodyne beams respectively generated by diffraction of the second and third light beams by the diffraction grating-shaped mark into a second beat signal, the second and heterodyne beam having the first wavelength, the third heterodyne beam having the second wavelength, the second and third heterodyne beams being returned through the projection optical system;

detecting a phase difference between the first and second beat signals;

adjusting a relative position in a diffraction grating-shaped mark measuring direction between a position on the diffraction grating-shaped mark illuminated by the second light beams and that thereon illuminated by the third light beams; and controlling the relative position on the basis of a first phase difference detected when light intensity of the third light beams on the substrate is decreased below a predetermined level and a second phase difference detected when light intensity of the first light beams on the reference optical member is decreased within the range in which the second heterodyne beam can be detected.

In an alignment apparatus according to the present invention, when the reference grating is aligned with the diffraction grating-shaped mark formed on the photosensitive substrate by using the two kinds of light beams having the different wavelengths (or colors), the reference grating diffracts the first two light beams having the different frequencies and the first wavelength to generate the first heterodyne beam comprising, for example, (±) primary diffracted light beams, and the first photoelectric detection device receives the first heterodyne beam to generate a first beat signal. The diffraction grating-shaped mark formed on the substrate diffracts the second two light beams having the different frequencies and the first wavelength to generate the second heterodyne beams comprising, for example, (±) primary diffracted light beams. The diffraction grating-shaped mark also diffracts the third two light beams having the different frequencies and the second wavelength to generate the third heterodyne beams comprising, for example, (±) primary diffracted light beams. The second photoelectric detection device receives the second and third heterodyne beams to generate a second beat signal.

First, with the light intensity of the light beams having the second wavelength being decreased, the first phase difference between the first and second beat signals is measured. Then while the light intensity of the light beams having the first wavelength is decreased within the range in which the first beat signal can be detected, the second phase difference between the first and second beat signals is detected. The relative position adjusting device adjusts the relative position between the position on the substrate illuminated by the second light beams and that thereon illuminated by the third light beams on the basis of the two phase differences. This allows the phase differences to be corrected, thereby enabling the amount of deviation between the two-colored interference fringes to be adjusted.

When performing the alignment after the adjustment is accomplished, the two-colored light beams illuminates the diffraction grating-shaped mark formed on the substrate to produce the second beat signal. Thus, even if one of the two light beams is decreased in light intensity due to the influence of a reflectance quality of the substrate, unevenness of the mark and so on, a position of the substrate can be detected with accuracy. On the other hand, with respect to the reference grating, even if the positions on the substrate to which the two-colored light beams are incident are shifted, the contrast of the first beat signal regarding the reference grating does not change. Generally, silica glass is coated with a chrome film and the reference grating is formed on the chrome film by patterning. Thus, it appears that the reference grating is ideally made, and it is not necessary to use two-colored light beams in order to perform alignment. Such an idea is employed in the present invention.

The relative position adjusting device synchronizes phases of the two beat signals on the basis of a command from the control device. In this case, decreasing an intensity of the first wavelength light enables the second beat signal relative to the diffraction grating-shaped mark formed on the substrate to be obtained with intensity of the light beam of the second wavelength being sufficient without receiving the influence of the first wavelength light, thereby performing a phase synchronization with accuracy.

In a case where the reference grating is formed on the mask and the reference grating includes a diffraction grating-shaped mark, an additional element on which the reference grating is provided is not necessary, and an amount of positional deviation between the mask and the substrate can be directly detected.

In a case where an illumination light controlling element for controlling chromatic aberration of a projection optical system relative to the light beams of the first wavelength so that the chromatic aberration becomes a predetermined value is provided in an area on a Fourier transform plane relative to the mask in the projection optical system or a plane adjacent to the Fourier transform plane through which the light beams of the first wavelength pass, and where another illumination light controlling element for controlling chromatic aberration of a projection optical system relative to the light beams of the second wavelength so that the chromatic aberration becomes a predetermined value is provided in an area on a Fourier transform plane relative to the mask in the projection optical system or a plane adjacent to the Fourier transform plane through which the light beams of the second wavelength pass, since the chromatic aberration relative to the two-colored alignment light beams which is caused by the projection optical system are corrected, an amount of positional deviation between the mask and the substrate can be detected by a TTR (Through-The-Reticle) type.

The present invention provides an alignment apparatus for detecting a position of a photosensitive substrate on the basis of a diffraction grating-shaped mark formed on the substrate comprising:

an illumination optical system for illuminating the diffraction grating-shaped mark with a first pair of light beams having different frequencies and a first wavelength and a second pair of light beams having different frequencies and a second wavelength different from the first wavelength;

a photoelectric detection device for photoelectrically transforming a first heterodyne beam having the first wavelength generated by diffraction of the first light beams by the diffraction grating-shaped mark and a second heterodyne beam having the second wavelength generated by diffraction of the second light beams by the diffraction grating-shaped mark into a beat signal;

a reference signal generating device for electrically generating a reference signal having a frequency corresponding to each of a frequency difference between the first light beams and a frequency difference between the second light beams;

a phase comparing device for detecting a phase difference between the reference signal generated from the reference signal generating device and the beat signal supplied from the photoelectric detection device;

a relative position adjusting device for adjusting a relative position in a diffraction grating-shaped mark measuring direction between a position on the diffraction grating-shaped mark illuminated by the first light beams and that thereon illuminated by the second light beams; and a control device for controlling the relative position adjusting device on the basis of a first phase difference detected by the phase comparing device when light intensity of the first light beams on the substrate is decreased below a predetermined level and a second phase difference detected by the phase comparing device when light intensity of the second light beams on the substrate is decreased below a predetermined level.

In one preferred embodiment, the illumination optical system comprises a heterodyne beam generating system including an acousto-optic modulator driven by a drive signal having a predetermined frequency difference, the acousto-optics modulator generates the first and second pairs of light beams, and the reference signal generating device generates the reference signal on the basis of the drive signal.

In another preferred embodiment, the alignment apparatus is provided on a projection exposure apparatus for transferring through a projection optical system a transferring pattern on a mask onto a photosensitive substrate, the illumination optical system illuminates the diffraction grating-shaped mark formed on the substrate with the first and second pairs of light beams through the projection optical system, and the photoelectric detection device receives the heterodyne beams generated by diffraction of the light beams by the diffraction grating-shaped mark through the projection optical system.

The present inventions also provides an alignment apparatus adapted to be provided on a projection exposure apparatus for projecting a transferring pattern image of a mask through a projection optical system onto a photosensitive substrate rested on a two-dimensionally movable stage and for performing an alignment between the mask and the substrate on the basis of a diffraction grating-shaped mask mark formed on the mask and a diffraction grating-shaped substrate mark formed on the substrate comprising:

- a first illumination optical system for illuminating the mask mark with at least one of a first pair of light beams having different frequencies and a first wavelength and a second pair of light beams having different frequencies and a second wavelength different from the first wavelength;

- a second illumination optical system for allowing the first light beams to pass through the projection optical system to generate a third pair of light beams having different frequencies and the first wavelength and allowing the second light beams to pass through the projection optical system to generate a fourth pair of light beams having different frequencies and the second wavelength to illuminate the substrate mark with the third and fourth light beams;

- a second photoelectric detection device for photoelectrically transforming third and fourth heterodyne beams respectively generated by diffraction of the third and fourth light beams by the substrate mark into a beat signal, the third heterodyne beams having the first wavelength, the fourth heterodyne beams having the second wavelength, the third and fourth heterodyne beams being respectively returned through the projection optical system;

- a reference signal generating device for electrically generating a reference signal having a frequency corresponding to each of a frequency difference between the first light beams and a frequency difference between the second light beams;

- a phase comparing device for detecting a phase difference between the reference signal generated from the reference signal generating device and the beat signal generated from the second photoelectric detection device;

- a relative position adjusting device for adjusting a relative position in a substrate mark measuring direction between a position on the substrate illuminated by the third light beams and that thereon illuminated by the fourth light beams; and

- a control device for controlling the relative position adjusting device on the basis of a first phase difference detected by the phase comparing device when light intensity of the third light beams on the substrate is decreased below a predetermined level and a second phase difference detected by the phase comparing device when light intensity of the fourth light beams on the substrate is decreased below another predetermined level.

In another preferred embodiment, the first illumination optical system illuminates the mask mark only with the first light beams.

In another preferred embodiment, the first illumination optical system comprises a heterodyne beam generating system for generating the first and second light beams, the heterodyne beam generating system includes an acousto-optic modulator which is driven by a drive signal having a predetermined frequency difference to generate the first and second light beams, and the reference signal generating device generates the reference signal on the basis of the drive signal.

In another preferred embodiment, the alignment apparatus further comprises a first photoelectric detection device for photoelectrically transforming a heterodyne beam generated by diffraction of one of the first and second light beams by the mask mark into a beat signal, a phase difference comparing device for detecting a phase difference between the beat signal generated from the first photoelectric detection device and the beat signal generated from the second photoelectric detection device, and a control device for controlling a relative position between the mask and the stage on the basis of the phase difference.

The present invention further provides an alignment apparatus for detecting a position of a photosensitive substrate on the basis of a diffraction grating-shaped mark formed on the substrate comprising:

- an illumination optical system for illuminating the diffraction grating-shaped mark with a first pair of light beams having different frequencies and a first wavelength and a second pair of light beams having different frequencies and a second wavelength different from the first wavelength;

- a photoelectric detection device for photoelectrically transforming a first heterodyne beam having the first wavelength generated by diffraction of the first light beams by the diffraction grating-shaped mark and a second heterodyne beam having the second wavelength generated by diffraction of the second light beams by the diffraction grating-shaped mark into a beat signal;

- a phase comparing device for detecting a phase difference between a predetermined reference signal and the beat signal supplied from the photoelectric detection device;

- a relative position adjusting device for adjusting a relative position in a diffraction grating-shaped mark measuring direction between a position on the diffraction grating-shaped mark illuminated by the first light beams and that thereon illuminated by the second light beams; and

- a control device for controlling the relative position adjusting device on the basis of a first phase difference detected by the phase comparing device when light intensity of the first light beams on the substrate is decreased below a predetermined level and a second phase difference detected by the phase comparing device when light intensity of the second light beams on the substrate is decreased below a predetermined level.

The present invention further provides a method for detecting a position of a photosensitive substrate on the basis of a diffraction grating-shaped mark formed on the substrate comprising:

illuminating the diffraction grating-shaped mark with a first pair of light beams having different frequencies and a first wavelength and a second pair of light beams having different frequencies and a second wavelength different from the first wavelength;

photoelectrically transforming a first heterodyne beam having the first wavelength generated by diffraction of the first light beams by the diffraction grating-shaped mark and a second heterodyne beam having the second wavelength generated by diffraction of the second light beams by the diffraction grating-shaped mark into a beat signal;

electrically generating a reference signal having a frequency corresponding to each of a frequency difference between the first light beams and a frequency difference between the second light beams;

detecting a phase difference between the reference signal and the beat signal;

adjusting a relative position in a diffraction grating-shaped mark measuring direction between a position on the diffraction grating-shaped mark illuminated by the first light beams and that thereon illuminated by the second light beams; and controlling the relative position on the basis of a first phase difference detected when light intensity of the first light beams on the substrate is decreased below a predetermined level and a second phase difference detected when light intensity of the second light beams on the substrate is decreased below a predetermined level.

The present invention further provides a method adapted to apply to a projection exposure apparatus for projecting a transferring pattern image of a mask through a projection optical system onto a photosensitive substrate rested on a two-dimensionally movable stage and for performing an alignment between the mask and the substrate on the basis of a diffraction grating-shaped mask mark formed on the mask and a diffraction grating-shaped substrate mark formed on the substrate comprising:

illuminating the mask mark with at least one of a first pair of light beams having different frequencies and a first wavelength and a second pair of light beams having different frequencies and a second wavelength different from the first wavelength;

allowing the first light beams to pass through the projection optical system to generate a third pair of light beams having different frequencies and the first wavelength and allowing the second light beams to pass through the projection optical system to generate a fourth pair of light beams having different frequencies and the second wavelength to illuminate the substrate mark with the third and fourth light beams;

photoelectrically transforming third and fourth heterodyne beams respectively generated by diffraction of the third and fourth light beams by the substrate mark into a beat signal, the third heterodyne beams having the first wavelength, the fourth heterodyne beams having the second wavelength, the third and fourth heterodyne beams being respectively returned through the projection optical system;

electrically generating a reference signal having a frequency corresponding to each of a frequency difference between the first light beams and a frequency difference between the second light beams;

detecting a phase difference between the reference signal and the beat signal;

adjusting a relative position in a substrate mark measuring direction between a position on the substrate illuminated by the third light beams and that thereon illuminated by the fourth light beams; and controlling the relative position on the basis of a first phase difference detected when light intensity of the third light beams on the substrate is decreased below a predetermined level and a second phase difference detected when light intensity of the fourth light beams on the substrate is decreased below another predetermined level.

The present invention further provides a method for detecting a position of a photosensitive substrate on the basis of a diffraction grating-shaped mark formed on the substrate comprising:

illuminating the diffraction grating-shaped mark with a first pair of light beams having different frequencies and a first wavelength and a second pair of light beams having different frequencies and a second wavelength different from the first wavelength;

photoelectrically transforming a first heterodyne beam having the first wavelength generated by diffraction of the first light beams by the diffraction grating-shaped mark and a second heterodyne beam having the second wavelength generated by diffraction of the second light beams by the diffraction grating-shaped mark into a beat signal;

detecting a phase difference between a predetermined reference signal and the beat signal;

adjusting a relative position in a diffraction grating-shaped mark measuring direction between a position on the diffraction grating-shaped mark illuminated by the first light beams and that thereon illuminated by the second light beams; and controlling the relative position adjusting device on the basis of a first phase difference detected when light intensity of the first light beams on the substrate is decreased below a predetermined level and a second phase difference detected when light intensity of the second light beams on the substrate is decreased below a predetermined level.

According to the alignment apparatus of the present invention, since light beams having two wavelengths (two colors) are used which comprise a pair of light beams having the first wavelength and a pair of light beams having the second wavelength, a position of the substrate can be detected with high accuracy without receiving any influence of thin film interference and the like on the substrate.

In addition, since deviation between an interference fringe on the substrate provided by a pair of light beams having the first wavelength and another interference fringe on the substrate provided by a pair of light beams having the second wavelength is adjusted by the reference signal having a frequency corresponding to each of a frequency difference between the light beams having the first wavelength and a frequency difference between the light beams having the second wavelength, the adjustment of the two-colored interference fringes can be performed without receiving any optical influence.

Additionally, in an alignment apparatus of the present invention, when the heterodyne beam generating system generates the first and second pairs of light beams by the acousto-optic modulator driven by the drive signal having a predetermined frequency difference, the reference signal generating device easily can generate the reference signal on the basis of the drive signal. The alignment apparatus of the present invention also enables a frequency of the beat signal from the photoelectric detection device to be in integral multiple relation to that of the reference signal to easily and precisely detect a phase difference between the beat signal and the reference signal to align the two-colored interference fringes with each other with high accuracy.

In a case where the alignment apparatus of the present invention is provided on a projection exposure apparatus for transferring through a projection optical system a transferring pattern on a mask onto a photosensitive substrate, where the illumination optical system illuminates the diffraction grating-shaped mark formed on the substrate with the first and second pairs of light beams through the projection optical system, and where the photoelectric detection device receives the heterodyne beams generated by diffraction of the light beams by the diffraction grating-shaped mark through the projection optical system, a TTL type can be employed in order to align interference fringes on the substrate produced by the two-colored light beams with each other with high accuracy.

According to the alignment apparatus of the present invention, since two-colored light beams comprising the third pair of light beams having the first wavelength and the fourth pair of light beams having the second wavelength are employed, alignment between the mask and the substrate can be performed with high accuracy without receiving any influence of thin film interference and the like on the substrate.

In addition, since deviation between an interference fringe provided on the substrate by a pair of light beams having the first wavelength and another interference fringe provided on the substrate by a pair of light beams having the second wavelength is adjusted by the reference signal having a frequency corresponding to each of a frequency difference between the third light beams and a frequency difference between the fourth light beams, the adjustment of the two-colored interference fringes can be performed without receiving any optical influence.

Additionally, in a case where the first illumination optical system illuminates the mask mark only with the first pair of light beams, since the mask mark is observed only with the single-colored light beam, there is no influence of deviation between the two-colored interference fringes on the mask mark, thereby enabling the first photoelectric detection device to stably supply the beat signal. If the mask mark is observed with two-colored illumination light as the substrate is done, adjustment of two-colored interference fringes on the substrate causes deviation between two-colored interference fringes to be generated on the mask mark. For example, in a case where the two-colored interference fringes are identical in the intensity thereof and where one of the two-colored interference fringes is deviated from the other colored interference fringe in its phase by a half pitch, the beat signal in the side of the mask disappears. In order to avoid such a happening, in the present invention, the mask mark is observed only with the single-colored light beam.

In this case, when adjusting the deviation between the two-colored interference fringes caused by the two-colored illumination light beams, employment of the following processing causes disappearance of the beat signal form the side of the mask.

First, the one-colored illumination light and the other colored illumination light alternately illuminate the substrate. Then, the second photoelectric detection device receives the heterodyne beams from the substrate mark to generate the beat signal. On the other hand, the first photoelectric detection device receives the heterodyne beams from the mask mark to generate the other beat signal. Comparison of phases of the two beat signals from the first and second photoelectric detection devices is performed. In such a processing, since the mask mark is not observed with a light beam of the second wavelength, adjustment of the interference fringe having the second wavelength causes disappearance of the beat signal form the side of the mask.

In the present invention, the reference signal generating device generates an electrical signal having a frequency which is identical to each of a frequency difference between the heterodyne beams from the substrate mark and a frequency difference between the heterodyne beams from the mask mark. The beat signal from the substrate mark is also produced. A phase difference between the two beat signals is detected. The relative position adjusting device adjusts a relative position between a portion of the substrate illuminated by the light beams having the first wavelength and a portion of the substrate illuminated by the light beams having the second wavelength. Thus, even if the first light beams of the first wavelength for observing the mask mark disappears, the deviation between the two-colored interference fringes can be adjusted.

Generally, a silica glass is coated with chrome film, and mask marks are formed on the chrome film by patterning. Thus, it appears that the mask marks are ideally made in comparison with the substrate marks. Therefore, it is not necessary to use two-colored illumination light beams having difference wavelengths in order to perform alignment. Such an idea is employed in the present invention. Namely, in the present invention, since the beat signal from the mask mark is produced from only the light beams having the first wavelength, performing of the adjustment by the relative position adjusting device enables the beat signal from the mask mark to stably be provided.

In the alignment apparatus of the present invention, in a case where the heterodyne beam generating system generates a first pair of light beams and a second pair of light beams by using the acousto-optic modulator which is driven by a drive signal having a predetermined frequency difference, the reference signal generating device can easily generate the reference signal on the basis of the drive signal. Since a frequency of the beat signal from the photoelectric detection device is in integral multiple relation to that of the reference signal, a phase difference between the beat signal and the reference signal can be easily and precisely detected to align the two-colored interference fringes with each other with high accuracy.

BRIEF DESCRIPTION OF THE DRAWINGS:

FIG. 2(a) is a front view mainly showing a stage system and an alignment optical system in the projection exposure system used in the embodiment of the present invention.

FIG. 2(b) is a side view of the stage system and the alignment optical system shown in FIG. 2(a).

DETAILED DESCRIPTION OF THE PREFERRED EMBODIMENTS

An alignment according to a preferred embodiment of the preset invention will be explained with reference to the drawings. In this embodiment, the present invention is applied to an alignment apparatus of a TTR type and of a heterodyne interference method which is employed in a projection exposure apparatus for transferring a pattern formed on a reticle to each of shot areas on a wafer through a projection optical system.

Figure 1:
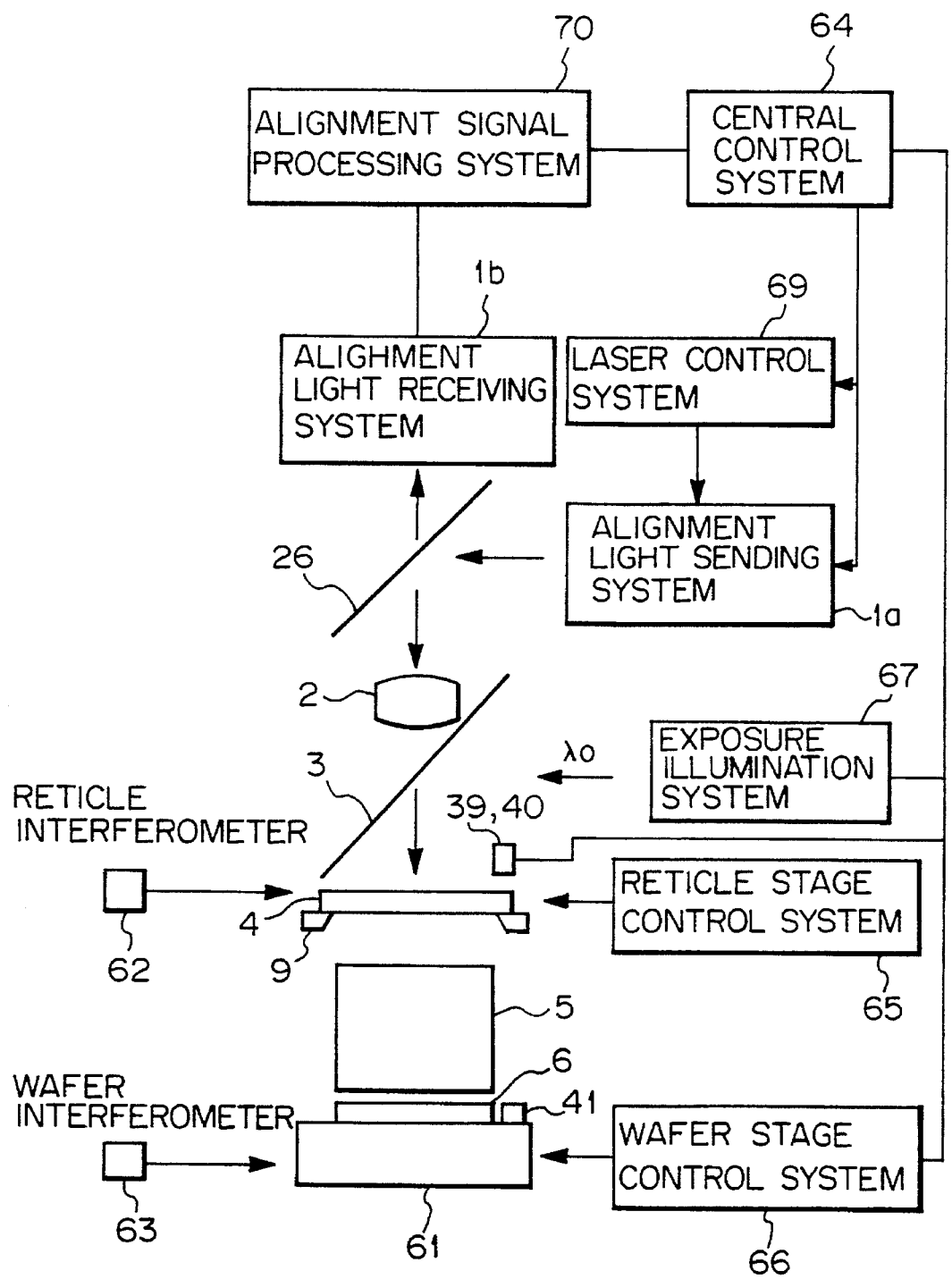
FIG. 1 is a block diagram schematically showing the whole arrangement of a projection exposure system used in the embodiment of the present invention.

FIG. 1 schematically shows a general construction of the projection exposure apparatus used in the embodiment. In FIG. 1, a reticle 4 is held on a reticle stage 9. A wafer 6 is held on a wafer stage 61. When performing exposure, an exposing illumination light of a wavelength $\lambda_0$ from an exposure illumination system 67 illuminates the reticle 4 through a dichroic mirror 3. By the illumination light, a pattern image of the reticle 4 is transferred to each of shot areas of the wafer 6 coated with a photoresist through a projection optical system 5. The reticle stage 9 and the wafer stage 61 respectively position the reticle 4 and the wafer 6 on respective planes which are perpendicular to the optical axis of the projection optical system 5. Two-dimensional coordinates of the reticle 9 and the wafer stage 61 are detected by a reticle-side interferometer 62 and a wafer-side interferometer 63, respectively. The detected results are supplied to a central control system 64. On the basis of the detected results, the central control system 64 controls operations of the reticle stage 9 and the wafer stage 61 through a reticle stage control system 65 and a wafer stage control system 66, respectively. A reference mark member 41 having reference marks formed thereon is fixedly mounted on the wafer stage 61. When performing reticle alignment, the reference mark member 41 is moved into an exposing field of the projection optical system 5, and the reference marks are illuminated from the bottom side thereof with illumination light of the wavelength $\lambda_0$ which is identical to that of the exposing illumination light. The illumination light beam passing through the reference mark passes through the projection optical system 5, and is incident to an alignment mark formed on the lower surface of the reticle 4 to afford the image of the reference mark thereon. Reticle alignment microscopes 39 and 40 are provided above the reticle 4. The microscopes 39 and 40 pick up the image of the alignment mark and the reference mark, respectively, and supply image signals to the central control system 64. The central control system 64 processes the supplied image signals to obtain an amount of deviation of the alignment mark relative to the reference mark.

In order to perform fine alignment for the wafer 6, an alignment system of a TTR type and of a heterodyne interference method is further provided. The alignment system includes a laser control system 69, an alignment light sending system 1a, a beam splitter 26, an objective lens 2, an alignment light receiving system 1b, an alignment signal processing system 70, and so on. When performing alignment, the central control system 64 controls two laser beam sources (stated hereinafter) provided in the alignment light sending system 1a through the laser control system 69 so that the two laser beam sources emit laser beams. The laser beams emitted from the two laser beam sources are modulated by a predetermined frequency, and are then directed to the beam splitter 26 as alignment light beams. The laser beams reflected by the beam splitter 26 pass through the objective lens 2 and the dichroic mirror 3, and is incident to the reticle 4. The laser beams passing through the reticle 4 are applied to the reference mark member 41 (or wafer mark).

Heterodyne beams are generated by the laser beams being diffracted by the reference mark member 41 (or wafer mark). The other heterodyne beams are generated by the laser beams being diffracted by the reticle mark. The heterodyne beams from the reference mark member 41 (or wafer mark) and the reticle mark are incident to the alignment light receiving system 1b through the dichroic mirror 3, the objective lens 2, and the beam splitter 26. In the alignment light receiving system 1b, two beat signals are generated. The beat signals are supplied to the alignment signal processing system 70, in which a phase difference between the two beat signals is detected. The detected phase difference is supplied to the central control system 64. The central control system 64 determines a target phase difference for alignment or performs final alignment on the basis of the detected phase difference.

Next, the reticle alignment microscope and the alignment system of a heterodyne method will be specifically explained.

FIGS. 2(a) and 2(b) show stage and alignment optical systems of the projection exposure system in this embodiment. In FIGS. 2(a) and 2(b), a Z-axis is taken to be parallel to the optical axis AX of the projection optical system 5. A X-axis and a Y-axis are defined by an orthogonal coordinate system which is set on a plane perpendicular to the Z-axis. FIG. 2(a) is a front view of the projection exposure apparatus as viewed in a Y-direction. FIG. 2(b) is a side view of FIG. 2(a). An alignment optical system 1 includes the alignment light sending system 1a, the beam splitter 26, and the alignment light receiving system 1b which are shown in FIG. 1. The wafer stage 61 in FIG. 1 includes a X-stage 8X for positioning the wafer 6 in a X-direction and a Y-stage 8Y for positioning the wafer 6 in the Y-direction. In FIGS. 2(a) and 2(b), a wafer holder 7 for holding the wafer 6 is provided between the wafer stage and the wafer 6. In actual practice, a Z-stage (not shown) for positioning the wafer 6 in a Z-direction is rested on the X-stage 8X, and the reference mark member 41 is provided on the Z-stage.

The alignment optical system 1 emits reticle alignment illumination light beams $RB_1$ and $RB_2$, wafer alignment illumination light beams $WB_1$ and $WB_2$, reticle alignment illumination light beams $RB_3$ and $RB_4$, and wafer alignment illumination light beams $WB_3$ and $WB_4$. The reticle alignment beams $RB_1$ and $RB_2$ respectively have an average wavelength $\lambda_1$ which is different from the wavelength $\lambda_0$ of exposure light, and have different frequencies. The frequency difference between the beams $RB_1$ and $RB_2$ is $\Delta f$ (=50 kHz). The wafer alignment beams $WB_1$ and $WB_2$ also respectively have the average wavelength $\lambda 1$, and have different frequencies. The frequency difference between the beams $WB_1$ and $WB_2$ is $\Delta f$ (=50 kHz). The reticle alignment beams $RB_3$ and $RB_4$ respectively have an average wavelength $\lambda_2$ which is close to the wavelength $\lambda_1$, and have different frequencies. The frequency difference between the beams $RB_3$ and $RB_4$ is $\Delta f$ (=50 kHz). The wafer alignment beams $WB_3$ and $WB_4$ also respectively have the average wavelength $\lambda_2$, and have different frequencies. The frequency difference between the beams $WB_3$ and $WB_4$ is $\Delta f$ (=50 kHz).

As shown in FIG. 2(a), the reticle alignment illumination light beams $RB_1$ and $RB_2$ is condensed on the reticle 4 by the objective lens 2, and are incident to a diffraction grating-shaped reticle mark 35A on the lower side of the reticle 4 at respective incident angles and $+\theta_{R1}$.

Figure 3:
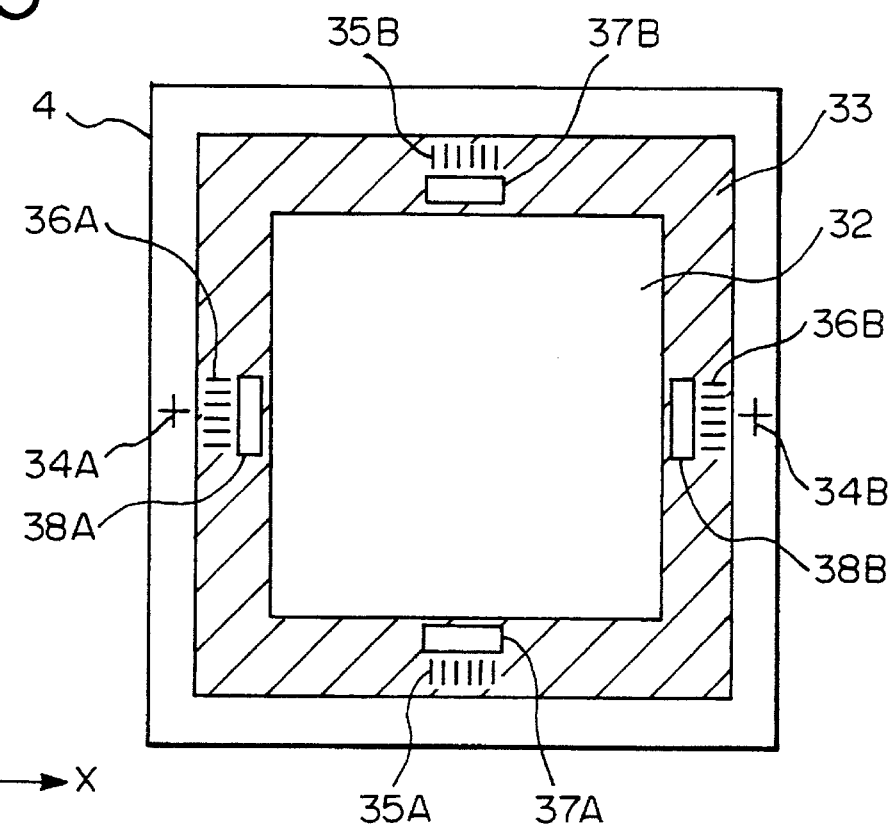
FIG. 3 is a plane view showing a pattern layout on a reticle in the arrangement shown in FIGS. 2(a) and 2(b).

FIG. 3 shows a pattern arrangement of the reticle 4 in this embodiment. In FIG. 3, the reticle 4 has a pattern area 32 in the center thereof. A light blocking zone 33 is provided around the central pattern area 32 of the reticle 4. Reticle marks 36A and 36B for the Y-axis are respectively provided in opposite sides of the light blocking zone 33 extending in the Y-direction. Each of the reticle marks 36A and 36B comprises a diffraction grating including a plurality of grating elements which are spaced at a pitch $P_R$ in the Y-direction. Reticle marks 35A and 35B for the X-axis are respectively provided in opposite sides of the light blocking zone 33 extending in the X-direction. Each of the X-axis reticle marks 35A and 35B comprises a diffraction grating including a plurality of grating elements which are spaced at a pitch $P_R$ in the X-direction. Transmissive windows (referred to as "reticle windows" hereinafter) 37A and 37B for allowing the alignment light directed toward the wafer to pass therethrough are provided inside of the reticle marks 35A and 35B, respectively. Reticle windows 38A and 38B for allowing the alignment light directed toward the wafer to pass therethrough are provided inside of the reticle marks 36A and 36B, respectively. The reticle 4 further has cross-shaped alignment marks 34A and 34B which are formed on opposite sides of the reticle 4 in the X-direction outside of the light blocking zone 33.

Figure 9:
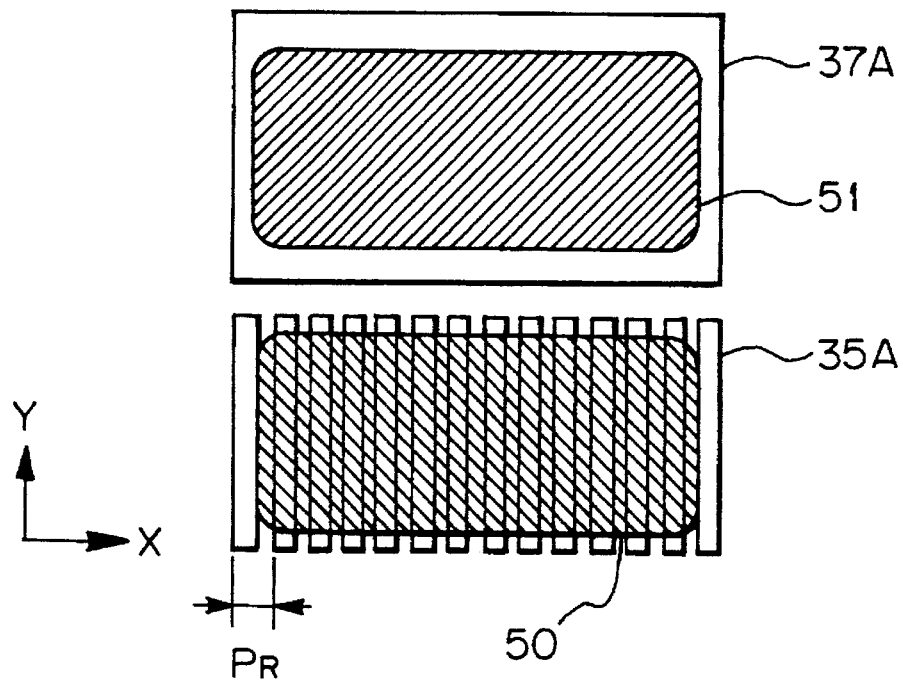
FIG. 9 is an enlarged plan view showing a reticle mark and a reticle window.

FIG. 9 is an enlarged view of the reticle mark 35A and the reticle window 37A which are shown in FIG. 3. The reticle mark 35A is illuminated with light beams 50 comprising the illumination light beams $RB_1$, $RB_2$, $RB_3$, and $RB_4$. Light beams 51 comprising the illumination light beams $WB_1$, $WB_2$, $WB_3$, and $WB_4$ pass through the reticle window 37A.

Referring back to FIGS. 2(a) and 2(b), the relation between the incident angles $-\theta_{R1}$ and $+\theta_{R1}$ and the grating pitch $P_R$ of the reticle mark 35A is indicated by the following numerical expression:

$$\sin(\theta_{R1}) = \lambda_1 / P_R \qquad (1)$$

A (+) primary diffracted light beam $RB_1^{+1}$ derived from the illumination light beam $RB_1$ and a (−) primary diffracted light beam $RB_2^{-1}$ derived from the illumination light beam $RB_2$ are emitted upwardly in a vertical direction relative to the reticle 4, and return to the alignment optical system 1 through the objective lens 2 as alignment detection light beams (or heterodyne beams).

Similarly, the reticle alignment beams $RB_3$ and $RB_4$ are condensed on the reticle 4 by the objective lens 2, and are incident to the reticle mark 35A on the reticle 4 at incident angles $-\theta_{R2}$ and $+\theta_{R2}$. A (+) primary diffracted light beam $RB_3^{+1}$ derived from the illumination light beam $RB_3$ and a (−) primary diffracted light beam $RB_4^{-1}$ derived from the illumination light beam $RB_4$ are emitted upwardly in a vertical direction relative to the reticle 4, and return to the alignment optical system 1 through the objective lens 2.

On the other hand, the wafer alignment illumination light beams $WB_1$ and $WB_2$ pass through the reticle window 37A of the reticle 4, and reach a chromatic aberration control plate 10 in the projection optical system 5. Diffraction grating-shaped longitudinal chromatic aberration control elements $G1_A$ and $G1_B$ are provided in portions of the chromatic aberration control plate 10 through which the wafer alignment illumination beams $WB_1$ and $WB_2$ pass, respectively (see FIG. 8). The wafer alignment illumination light beams $WB_1$ and $WB_2$ are bent by the control elements $G1_A$ and $G1_B$ by angles $-\theta_{G1}$ and $+\theta_{G1}$, respectively, and are incident to a diffraction grating-shaped wafer mark 48A at respective incident angles $-\theta_{w1}$ and $+\theta_{w1}$ relative thereto.

Figure 4:
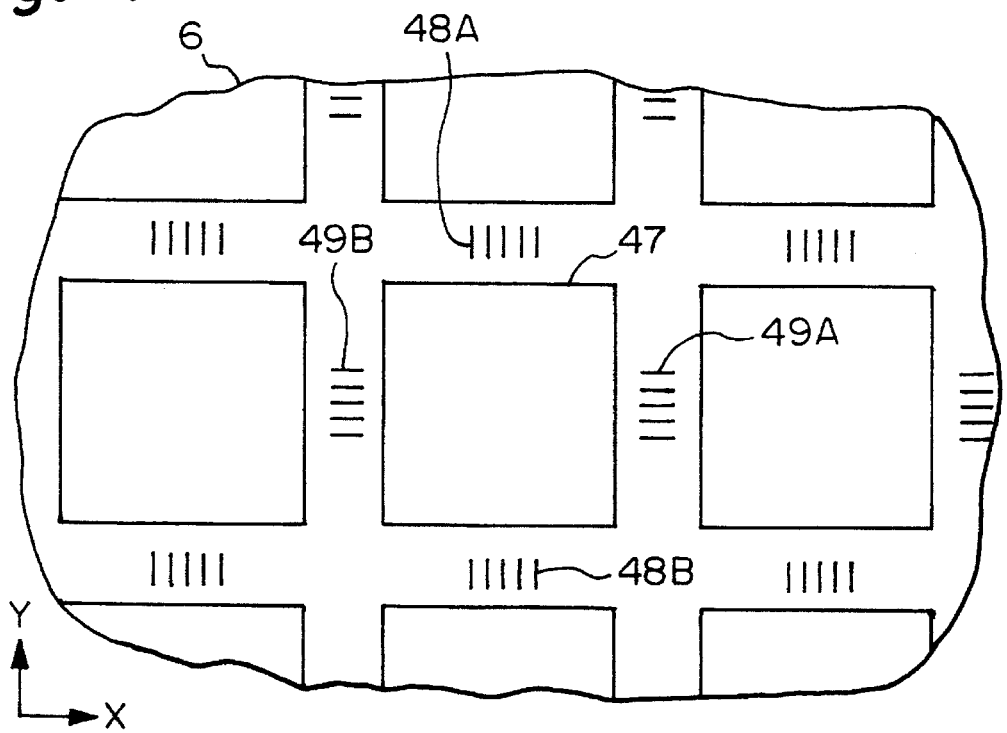
FIG. 4 is an enlarged plan view showing shot regions and wafer marks on a wafer in the arrangement shown in FIGS. 2(a) and 2(b).

FIG. 4 shows a part of the shot areas layout on the wafer 6. In FIG. 4, wafer marks 49A and 49B for the Y-axis are provided at opposite sides of an exposed shot area 47 in the X-direction outside of thereof, respectively. Each of the wafer marks 49A and 49B comprises a diffraction grating including grating elements which are spaced at a pitch $P_W$ in the Y-direction. Wafer marks 48A and 48B for the X-axis are provided at opposite sides of the exposed shot area 47 in the Y-direction outside of thereof, respectively. Each of the X-axis wafer marks 48A and 48B comprises a diffraction grating including grating elements which are spaced at the pitch $P_W$ in the X-direction. Wafer marks are also provided around the other shot areas.

Figure 10:
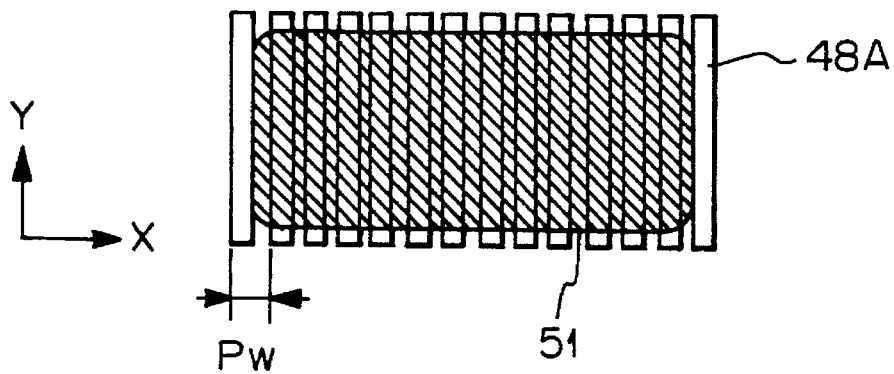
FIG. 10 is an enlarged plan view showing a wafer mark.

FIG. 10 is an enlarged view of the wafer mark 48A shown in FIG. 4. In FIG. 10, the wafer mark 48A is illuminated with light beams 51 comprising the illumination light beams $WB_1$, $WB_2$, $WB_3$, and $WB_4$.

Referring back to FIG. 2(a), the relation between the incident angles $-\theta_{w1}$ and $+\theta_{w1}$ and the grating pitch $P_W$ of the wafer mark 48A is indicated by the following numerical expression:

$$\sin(\theta_{w1}) = \lambda_1 / P_W \qquad (2)$$

A (+) primary diffracted light beam $WB_1^{+1}$ derived from the illumination light beam $WB_1$ and a (−) primary diffracted light beam $WB_2^{-1}$ derived from the illumination light beam $WB_2$ are emitted upwardly in a vertical direction relative to the wafer mark 48A, and the two diffracted light beams serve as alignment detection light beams (or heterodyne beams).

Similarly, since the wafer alignment beams $WB_3$ and $WB_4$ are close to the illumination light beams $WB_1$ and $WB_2$ in their wavelength, it can be taken that the wafer alignment beams $WB_3$ and $WB_4$ substantially pass through the longitudinal chromatic aberration control elements $G1_A$ and $G1_B$, respectively. Thus, the illumination light beams $WB_3$ and $WB_4$ are bent by the control elements $G1_A$ and $G1_B$ by angles $-\theta_{G2}$ and $+\theta_{G2}$, respectively, and are incident to the wafer mark 48A at incident angles $-\theta_{W2}$ and $+\theta_{W2}$ relative thereto, respectively. A (+) primary diffracted light beam $WB_3^{+1}$ derived from the illumination light beam $WB_3$ and a (−) primary diffracted light beam $WB_4^{-1}$ derived from the illumination light beam $WB_4$ are emitted upwardly in a vertical direction relative to the wafer mark 48A, and are used as alignment detection light beams.

In this case, as shown in FIG. 2(b), the wafer alignment illumination light beams are inclined by an angle $\theta_m$ relative to the wafer 6 in the non-measuring direction (or the Y-direction) by means of deflection function of the chromatic aberration control plate 10, and is incident to the wafer 6. Thus, a position on the chromatic aberration control plate 10 through which each of the alignment detection light beams passes is different from a position thereon through which each of the illumination light beams passes. The alignment detection light beams from the wafer mark 48A pass through a longitudinal chromatic aberration control element $G1_c$ on the chromatic aberration control plate 10 (see FIG. 8), thereby enabling chromatic aberration of the alignment detection light beams to be corrected in a lateral direction before directed to the reticle window 37A. Thereafter, each of the detection light beams returns to the alignment optical system 1 through the reticle window 37A and the objective lens 2. The wafer alignment illumination light beams illuminate a position on the surface of the wafer 6 which is deviated by $\Delta\beta$ in the Y-direction from a position thereon which would be illuminated if the control plate 10 is not arranged.

Figure 8:
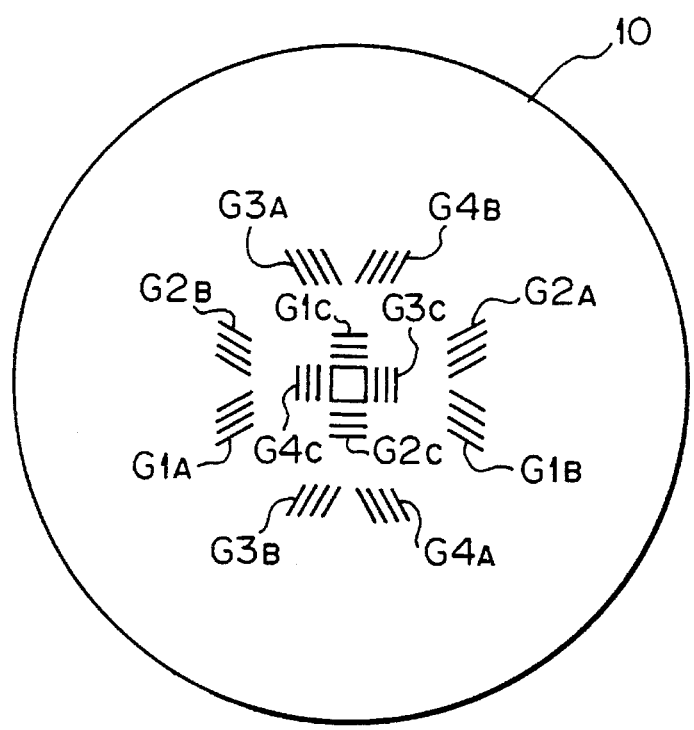
FIG. 8 is a plane view of the arrangement of axial chromatic aberration control elements on a chromatic aberration control plate in the arrangement shown in FIGS. 2(a) and 2(b).

FIG. 8 shows the chromatic aberration control plate 10. The chromatic aberration control plate 10 includes a transmissive glass substrate. Twelve longitudinal chromatic aberration control elements are arranged on the glass substrate. The three longitudinal chromatic aberration control elements $G1_A$, $G1_B$, and $G1_c$ are used for deflecting the wafer alignment illumination light beams and the alignment detection light beams in the alignment optical system 1 as shown in FIGS. 2(a) and 2(b). In actual practice, since there are the other three alignment optical systems for three axes, a total of twelve (=3 * 4) longitudinal chromatic aberration control elements $G1_A$, $G1_B$, and $G1_c$ . . . $G4_A$, $G4_B$, and $G4_c$ are provided on the chromatic aberration control plate 10.

Figure 6A:
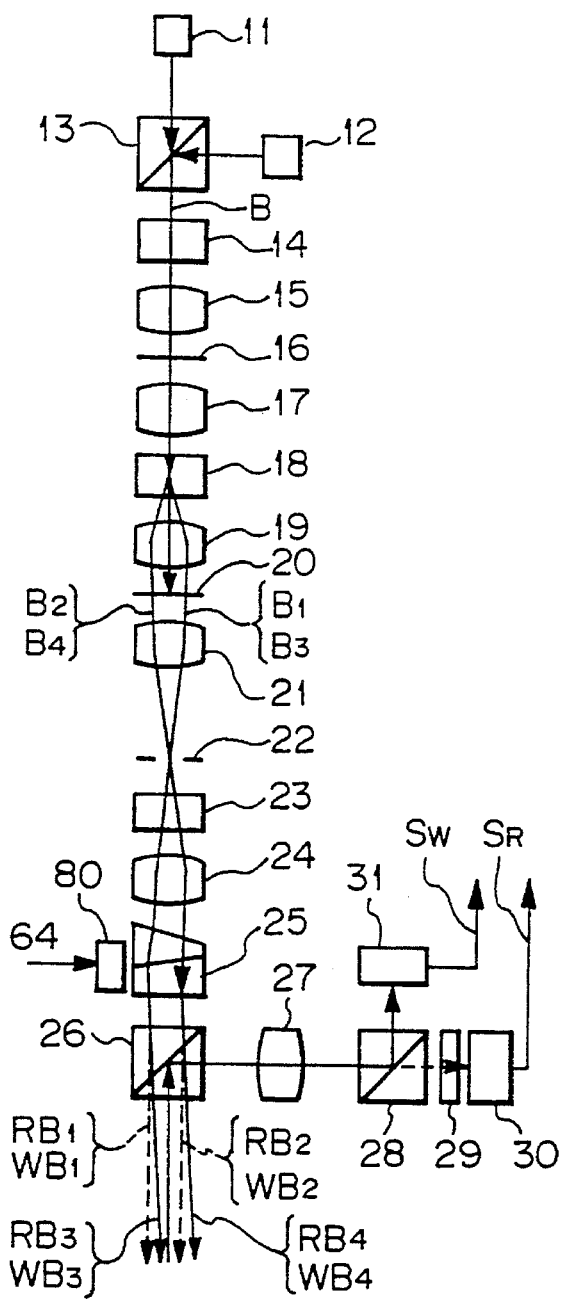
FIG. 6(a) is a front view showing the arrangement of the alignment optical system shown in FIGS. 2(a) and 2(b).
Figure 6B:
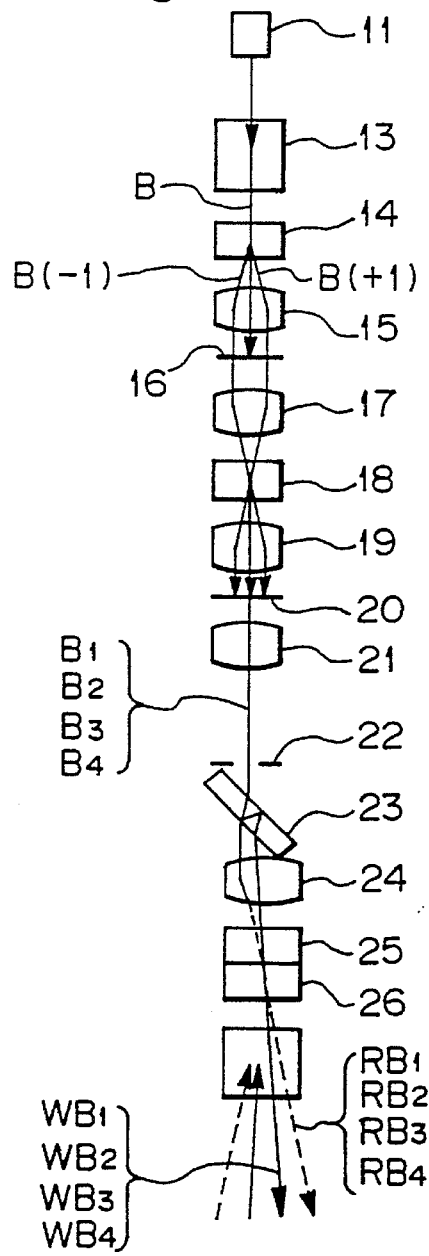
FIG. 6(b) is a side view of the alignment optical system shown in FIG. 6(a).
Figure 6C:
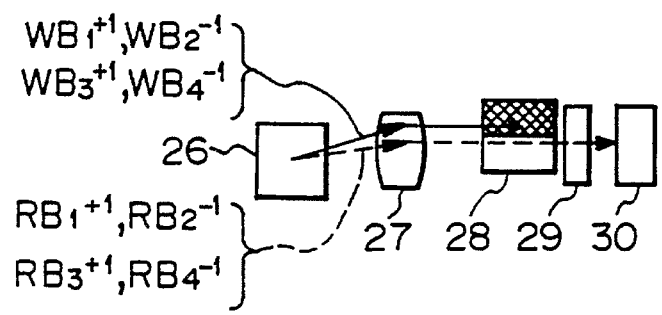
FIG. 6(c) is a bottom view of the alignment optical system shown in FIG. 6(a).
Figure 7:
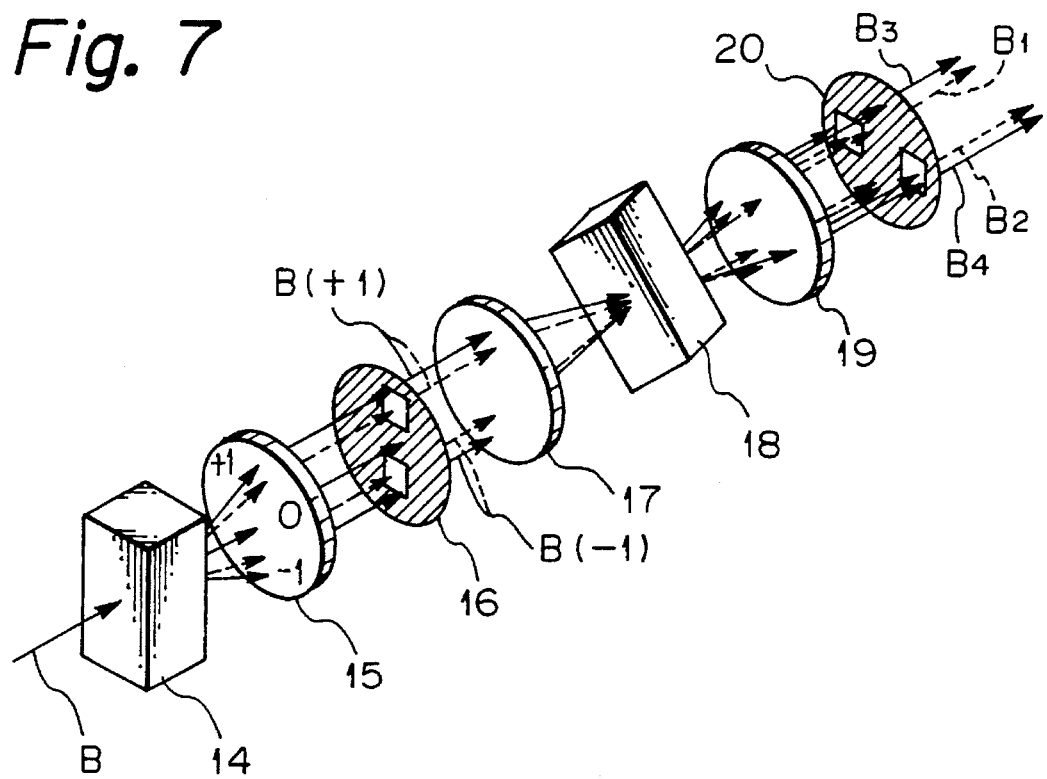
FIG. 7 is a perspective view showing the arrangement from an AOM to a spatial filter.

With reference to FIGS. 6(a) and 6(b) and 7, the alignment optical system 1 will be explained more specifically. FIG. 6(b) is a view as the alignment optical system 1 is viewed in the same direction as in FIG. 2. FIG. 6(a) is a view as the alignment optical system 1 is viewed in the same direction as in FIG. 2(a). FIG. 6(c) is a bottom view of the arrangement shown in FIG. 6(a). FIG. 7 is a perspective view showing a front portion of the alignment optical system.

In FIG. 6, a beam combining prism 13 combines a laser beam of the wavelength $\lambda_1$ emitted from a first laser beam source 11 such as a laser diode and a laser beam of the wavelength $\lambda_2$ emitted from a second laser beam source 12 such as a He-Ne laser beam source into an illumination light B. The illumination light B is incident to an acousto-optic modulator 14 (referred to as "AOM" hereinafter) driven at a frequency $F_1$. Most of the AOMs are of a type (so-called Bragg type AOM) in which light beams are made incident at a Bragg angle in order to enhance intensity of a (+) primary diffracted light beam. In this embodiment, the AOM 14 is of a Raman-Nath type in which light beams are made incident vertically so that (±) primary diffracted light beams are uniformly provided by Raman-Nath diffraction. Since the wavelengths of the two laser beams of the illumination light B are somewhat different, diffracted light beams derived from the two laser beams of the illumination light B are emitted at somewhat different angles by the AOM 14. FIG. 7 shows diffracted light beams moving in different directions depending on a wavelength by using a solid line and a broken line. The frequency difference between the illumination light B and the (+) primary diffracted light beams is $+F_1$. The frequency difference between the illumination light B and the (−) primary diffracted light beams is $-F_1$.

In FIG. 7, the laser beams emitted from the AOM 14 pass through a lens 15, and are incident to a spatial filter 16. Only the (±) primary diffracted light beams are selected from the laser beams by the spatial filter 16. The selected diffracted light beams pass through a lens 17, and are incident to a AOM 18 to cross with respect to each other. The AOM 18 is located to be turned by 45 degrees relative to the AOM 14 and is driven with a drive signal of a frequency $F_2$. The AOM 18 is that of a Bragg type. An incident angle is set to be 1/sin 45° of Bragg angle. Thus, as viewed from a plane turned by 45 degrees about an optical axis, the incident angle of the diffracted light beams is Bragg angle. In this case, the laser beams are subjected to frequency modulation of $+F_1$ in the AOM 14, and pass through the AOM 18. In the AOM 18, (−) primary diffracted light beams strong in intensity are generated, and the (−) primary diffracted light beams are subjected to frequency modulation of $-F_2$. Thus, the laser beams emitted from the laser beam sources 11 and 12 are subjected to frequency modulation of $+(F_1-F_2)$ before being emitted as alignment beams $B_1$ and $B_3$. Similarly, the laser beams are subjected to frequency modulation of $-F_1$ in the AOM 14, and pass through the AOM 18. In the AOM 18, (+) primary diffracted light beams strong in intensity are generated, and the (+) primary diffracted light beams are subjected to frequency modulation of $+F_2$. The laser beams emitted from the laser beam sources 11 and 12 are subjected to frequency modulation of $-(F_1-F_2)$ before being emitted as alignment beams $B_2$ and $B_4$. As a result, the frequency difference $\Delta f$ between the alignment beam $B_1$ and the alignment beam $B_2$ is shown as $2(F_1-F_2)$, and the frequency difference $\Delta f$ between the alignment beam $B_3$ and the alignment beams $B_4$ is also shown as $2(F_1-F_2)$. In this embodiment, the frequency difference $\Delta f$ is set to be 50 kHz. The laser beams passing through the AOM 18 are incident to a spatial filter 20. The alignment beams $B_1$, $B_2$, $B_3$, and $B_4$ are selected from the laser beams by the spatial filter 20 to be directed to systems arranged next thereto.

As shown in FIG. 6, the alignment beams $B_1$, $B_2$, $B_3$, and $B_4$ are condensed on a filed stop 22 by a lens 21. Configuration of the alignment beams on the reticle or the wafer is determined by the filed stop 22 before the alignment beams $B_1$, $B_2$, $B_3$, and $B_4$ are separated into the reticle alignment illumination light beams $RB_1$, $RB_2$, $RB_3$, and $RB_4$ and the wafer alignment illumination beams $WB_1$, $WB_2$, $WB_3$, and $WB_4$ by a reticle and wafer beams separating prism 23. Thereafter, the alignment illumination light beams pass through a lens 24, and reach a direct-vision prism 25. The direct-vision prism 25 is rotatable about the optical axis, and is driven by a motor 80 in line with instructions from the central control system 64 shown in FIG. 1. The rotation of the direct-vision prism 25 allows the relative angle between the two-colored illumination light beams having the wavelengths $\lambda_1$ and $\lambda_2$ to be changed, thereby separating the alignment illumination light beams $RB_1$, $RB_2$, $RB_3$, $RB_4$, $WB_1$, $WB_2$, $WB_3$, and $WB_4$ into the illumination light beams $RB_1$, $WB_1$, $RB_2$, and $WB_2$ having the wavelength $\lambda_1$ and the illumination light beams $RB_3$, $WB_3$, $RB_4$, and $WB_4$ having the wavelength $\lambda_2$. The illumination light beams having the wavelengths $\lambda_1$ and $\lambda_2$ the relative angle of which is changed thus pass through the beam splitter 26, and are directed to the objective lens 2 shown in FIG. 2. Changing of the relative angle between the illumination light beams having the wavelengths $\lambda_1$ and $\lambda_2$ allows a relative relation between a position on the reticle which the one-colored illumination light beams having the wavelength $\lambda_1$ illuminate and a position on the reticle which the other colored illumination light beams having the wavelength $\lambda_2$ illuminate to be changed. Similarly, changing thereof allows a position on the wafer which the one-colored beams illuminate and a position on the reticle which the other colored beams illuminate to be changed.

On the other hand, when the alignment detection light beams from the reticle mark 37A and the wafer mark 48A return to the alignment optical system 1 (see FIG. 6), the detection light beams are reflected by the beam splitter 26. The reflected light beams pass through a lens 27, and are separated into reticle detection light beams and wafer detection light beams by a detection light separating prism 28 which is disposed in conjugate relation to both the reticle and the wafer. The reticle detection light beams $RB_1^{+1}$, $RB_2^{-1}$, $RB_3^{+1}$, and $RB_4^{-1}$ pass through the detection light separating prism 28, and enter a color filter 29 for allowing light beams having only the wavelength $\lambda_1$ to pass therethrough. The color filter 29 selects only the reticle detection light beams $RB_1^{+1}$ and $RB_2^{-1}$ therefrom, and a photoelectric detection element 30 receives the selected beams $RB_1^{+1}$ and $RB_2^{-1}$. The wafer detection light beams $WB_1^{+1}$, $WB_2^{-1}$, $WB_3^{+1}$, and $WB_4^{-1}$ are reflected by the detection light separating prism 28, and are received by a photoelectric detection element 31. The photoelectric detection element 30 generates a reticle beat signal $S_R$ corresponding to a position of the reticle mark. The photoelectric detection element 31 generates a wafer beat signal $S_W$ corresponding to a position of the wafer mark.

The reticle beat signal $S_R$ is a sinusoidal beat signal of frequency $\Delta f$ formed from the detection light beams $RB_1^{+1}$ and $RB_2^{-1}$. The wafer beat signal $S_W$ is a sinusoidal beat signal of frequency $\Delta f$ formed from the detection light beams $WB_1^{+1}$, $WB_2^{-1}$, $WB_3^{+1}$, and $WB_4^{-1}$. The phase difference $\Delta\phi$ [rad] between the two beat signals is changed by the movement of the reticle 4 relative to the wafer 6 in the X-direction. Similarly, the phase difference $\Delta\phi$ is changed by the movement of the wafer 6 relative to the reticle 4 in the X-direction. The amount of relative movement $\Delta x$ thereof is indicated by the following expressions:

$$\Delta X \text{ (on the reticle)} = P_R \cdot \Delta\phi/(4\pi) \quad (3)$$

$$\Delta X \text{ (on the wafer)} = P_W \cdot \Delta\phi/(4\pi) \quad (4)$$

It should be noted that by the alignment system for the Y-direction, beat signals corresponding to a reticle mark and a wafer mark for the Y-axis are obtained, and a phase difference between the beat signals is determined.

It should be noted that although in FIGS. 2(*a*) and 2(*b*) the wafer mark is positioned under the projection optical system 5, when the alignment optical system 1 is to be adjusted (or calibrated), the reference mark member 41 is moved to a position under the projection optical system 5, and a grating mark on the reference mark member 41 is illuminated with the wafer alignment illumination light beams.

Figure 5:
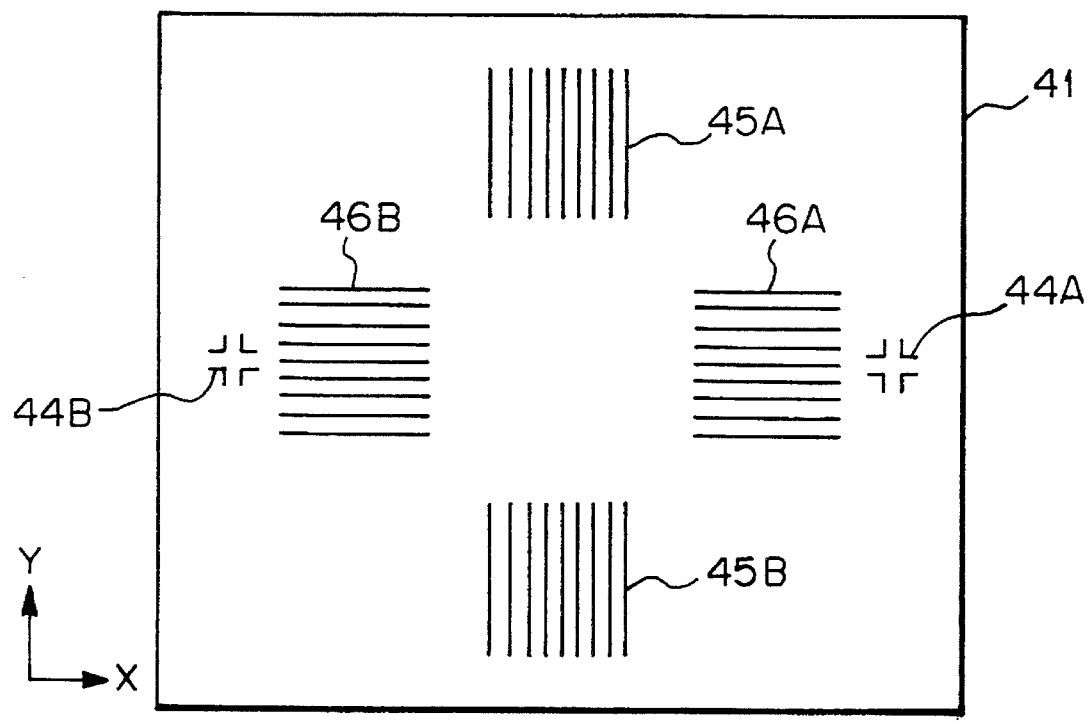
FIG. 5 is an enlarged plan view showing a mark layout on a reference mark member in the arrangement shown in FIGS. 2(a) and 2(b).

FIG. 5 is a plan view showing the arrangement on the reference mark member 41. In FIG. 5, the reference mark member 41 is formed from a transmissive glass substrate or the like. The reference mark member 41 includes on the upper surface thereof frame-shaped reference marks 44A and 44B which are spaced from each other in the X-direction. In the space between the reference marks 44A and 44B, diffraction grating-shaped reference diffraction grating marks 46A, 46B, 45A, and 45B are formed. Each of the reference diffraction grating marks 46A and 46B comprises a plurality of grating elements which are spaced by a pre-determined pitch in the Y-direction. Each of the reference diffraction grating marks 45A and 45B comprises a plurality of grating elements which are spaced by a predetermined pitch in the X-direction. The pitch of the reference diffraction grating marks 45A to 46B is equal to the pitch of the wafer marks 48A to 49B shown in FIG. 4.

As described above, when reticle alignment is to be carried out, the reference mark member 41 is moved into the exposure field of the projection optical system 5, and the reference marks 44A and 44B are illuminated with illumination light from the bottom side thereof. The illumination light from the bottom side of the reference marks 44A and 44B has the wavelength $\lambda_0$ which is the same as that of the illumination light for exposure. When the calibration for alignment optical system 1 is to be performed, the reference mark member 41 is also moved into the exposure field of the projection optical system 5, and the grating mark 45A on the reference mark member 41 is illuminated with the wafer alignment illumination light in the same way as the wafer mark.

Thus, in the alignment optical system 1 employed in the projection exposure apparatus according to this embodiment, two-colored illumination light beams having the wavelengths $\lambda_1$ and $\lambda_2$ are used for the wafer marks in order to decrease the influence of the thin film interference, etc. In addition, the color filter 29 for allowing only light beams of the wavelength $\lambda_1$ to pass therethrough is provided at a position upstream of the photoelectric detection element 30 for the reticle mark to block the light beams of the wavelength $\lambda_2$ so that the photoelectric detection element 30 generates the reticle beat signal $S_R$ formed from only the light beams of the wavelength $\lambda_1$, thereby eliminating the influence of deviation between the two-colored interference fringes on the reticle marks. The additional provision of the rotatable direct-vision prism 25 in the alignment optical system 1 allows the relative position between portions of the wafer which are illuminated with the two-colored illumination light beams having wavelengths $\lambda_1$ and $\lambda_2$ to be changed.

Next, the operation of alignment according to the embodiment will be specifically explained mainly referring to FIG. 1. The operation of alignment comprises a first step for calibration of the alignment optical system 1 and a second step for exposure of the wafer 6. It should be noted that though the following is explanation for positioning of the reticle and the wafer in the X-direction, positioning thereof in the Y-direction is performed in the same way as in the X-direction.

First, the first step for calibration of the alignment optical system 1 will be explained. The reticle 4 is transferred on the reticle stage 9 by a reticle auto-loader (not shown). Reticle alignment for the reticle 4 is then carried out. By using the exposure light of the wavelength $\lambda_0$ as illumination light, the reticle marks 34A and 34B and the reference marks 44A and 44B are observed with the reticle alignment microscopes 39 and 40 to perform the reticle alignment. As shown in FIG. 3, the reticle marks 34A and 34B are formed on the reticle 4. As shown in FIG. 5, the reference marks 44A and 44B are formed on the reference mark member 41 mounted on the wafer stage 61. When the reticle alignment is finished, the reference diffraction grating mark 45A (see FIG. 5) on the reference mark member 41 is illuminated with the wafer alignment illumination light beams (or the laser beams) emitted from the alignment light sending system 1a.

The wafer alignment illumination light beams applied to the reference diffraction grating mark 45A are diffracted by the grating mark 45A. The diffracted light beams from the reference diffraction grating mark 45A are received by the alignment light receiving system 1b. A beat signal (which is also referred to as "a wafer beat signal $S_W$") is generated from the photoelectric detection element 31. The beat signal is supplied to the central control system 64 through the alignment signal processing system 70. The central control system 64 adjusts the rotation angle of the direct-vision prism 25 provided within the alignment light sending system 1a through the motor 80 shown in FIG. 6(a) so that the beat signal $S_W$ is maximized in its amplitude. By the adjustment thereof, pre-alignment (or coarse adjustment) is finished.

After the coarse adjustment is finished, fine adjustment process is carried out. The fine adjustment process comprises a first fine adjustment step and a second fine adjustment step.

In the first fine adjustment step, in the line with the instructions from the central control system 64, the laser control system 69 shuts off the second laser beam source 12 emitting the laser beam of the wavelength $\lambda_2$ shown in FIGS. 6(a) and 6(b). In this case, the relative position between the reticle 4 and the reference mark member 41 is detected by only the laser beam of the wavelength $\lambda_1$ from the first laser beam source 11.

Figure 11:
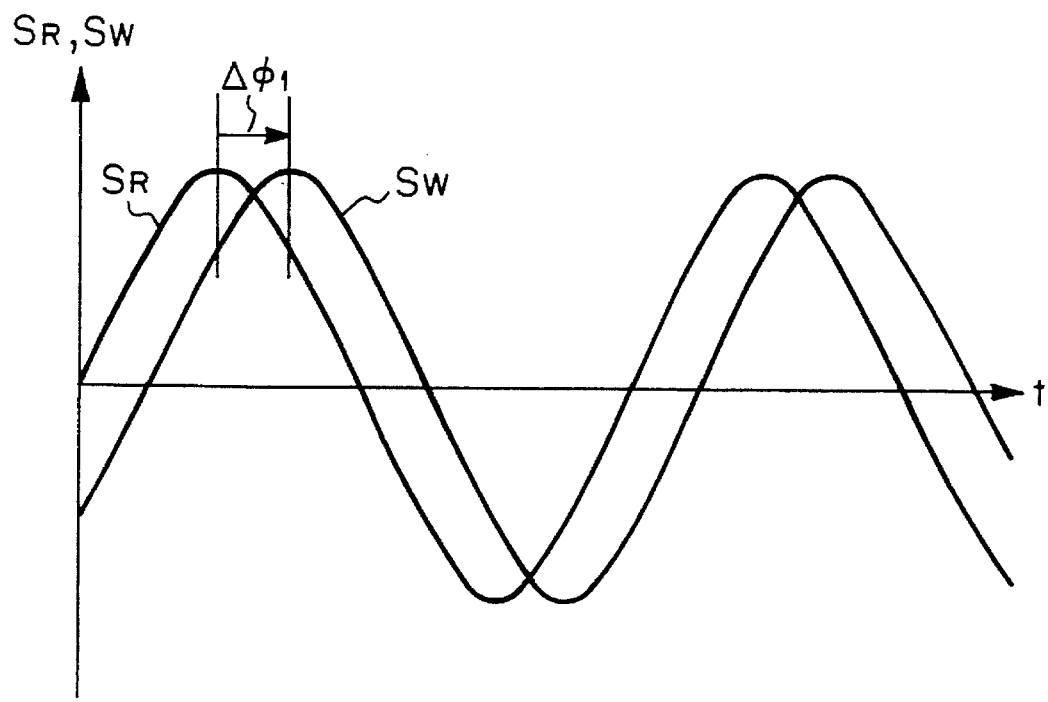
FIG. 11 is a waveform chart showing the phase relationship between two beat signals obtained by an alignment system of a heterodyne interference method in the embodiment, when emitting a single-colored alignment light beam.

FIG. 11 shows the reticle beat signal $S_R$ corresponding to the reticle mark 35A and the wafer beat signal $S_W$ corresponding to the reference diffraction grating mark 45A. The reticle and wafer beat signals $S_R$ and $S_W$ are supplied to the alignment signal processing system 70 as alignment signals in the first fine adjustment step. In FIG. 11, a horizontal axis shows time (t), and a vertical axis shows amplitude of the signals $S_R$ and $S_W$. In this case, the alignment signal processing system 70 determines a phase difference $\Delta\phi_1$ between the reticle and wafer beat signals $S_R$ and $S_W$. It is preferable that the phase difference $\Delta\phi_1$ is close to zero (0). However, it is not always necessary for the phase difference $\Delta\phi_1$ to be zero.

Next, in the second fine adjustment step, in line with the instructions from the central control system 64, the laser control system 69 turns on the second laser beam source 12 shown in FIG. 6(a), and decreases the power of the first laser beam source 11 emitting the laser beam of the wavelength $\lambda_1$ up to one-tenth of the power thereof in the first fine adjustment step. Since the color filter 29 blocks the light beams of the wavelength $\lambda_2$, the photoelectric detection element 30 for the reticle mark 35A receives only the diffracted light beams of the wavelength $\lambda_1$ to generate the reticle beat signal $S_R$. The photoelectric detection element 31 for the reference diffraction grating mark 45A receives the two-colored diffracted light beams having the wavelengths $\lambda_1$ and $\lambda_2$ to generate the wafer beat signal $S_W$. It should be noted that though according to the embodiment the power of the first laser beam source 11 emitting the laser beam of the wavelength $\lambda_1$ in the second fine adjustment step is set to be one-tenth of the power thereof in the first fine adjustment step, it is not always necessary to do so. It is necessary to decrease the power of the first laser beam source 11 to the extent that the light beams of the wavelength $\lambda_1$ do not influence the level of the wafer beat signal $S_W$ obtained from the light beams of the wavelength $\lambda_2$. In other words, it is necessary to decrease the power of the first laser beam source 11 to the extent that the detection light beams $WB_3^{+1}$ and $WB_4^{-1}$ (shown in FIG. 6) can be received by photoelectric detection element 31, which detection light beams are generated by diffraction of the light beams of the wavelength $\lambda_2$ by the reference diffraction grating mark 45A.

Figure 12:
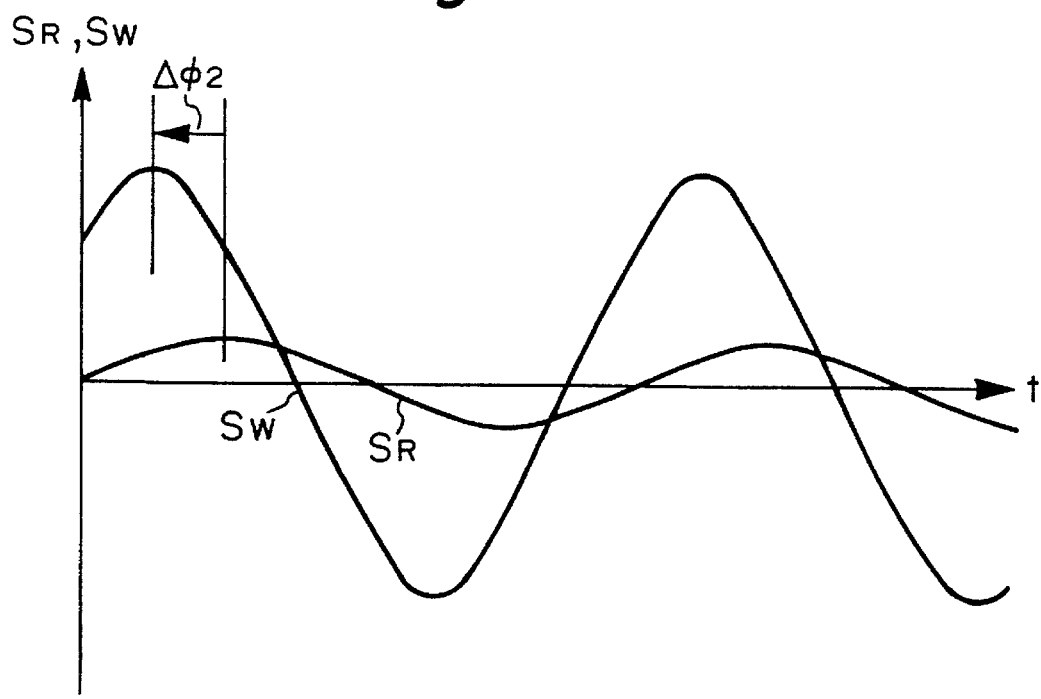
FIG. 12 is a waveform chart showing the phase relationship between two beat signals obtained by an alignment system of a heterodyne interference method in the embodiment, when emitting two-colored alignment light beams with the light quantity of the one-colored light beam being decreased.

FIG. 12 shows in the same way as FIG. 11 the reticle beat signal $S_R$ and the wafer beat signal $S_W$ obtained through the second fine adjustment step. In a case where a ration of the first laser beam source 11 to the second laser beam source 12 is set to be 1:1 in light intensity, in the second fine adjustment step relative to the first fine adjustment step, the reticle beat signal $S_R$ is decreased in its intensity to one-tenth and the wafer beat signal $S_W$ is increased in its intensity up to eleven-tenths. In FIG. 12, however, in order to clarify the relation between the reticle and wafer beat signals $S_R$ and $S_W$, the two signal are enlarged in the vertical direction of FIG. 12 with holding of the relative ration between the two signals. From a result indicated by FIG. 12, the alignment signal processing system 70 determines the phase difference $\Delta\phi_2$ between the reticle beat signal $S_R$ and the wafer beat signal $S_W$.

The central control system 64 receives the phase differences $\Delta\phi_1$ and $\Delta\phi_2$ computed by the alignment signal processing system 70, and computes the relative difference $\Delta\phi$ ($=\Delta\phi_1-\Delta\phi_2$). Making the relative difference $\Delta\phi$ zero is advantageous. However, it is permissible if the relative difference $\Delta\phi$ is below a predetermined value. If the relative difference $\Delta\phi$ is over the permissible level, in line with the instructions of the central control system 64, the rotation angle of the direct-vision prism 25 provided in the alignment light sending system 1a is adjusted according to the relative difference $\Delta\phi$. Thereafter, the phase differences $\Delta\phi_1$ and $\Delta\phi_2$ are measured again in the same way, and the same operation is repeated until the relative difference $\Delta\phi$ is below the permissible level. The permissible level of the relative difference $\Delta\phi$ depends on alignment accuracy to be required. As LSIs are highly integrated, high accuracy of a relative difference $\Delta\phi$ less than or equal to 10 nm will be required as measured by converting the relative difference $\Delta\phi$ to a length on the wafer stage 61.

By the above process, the two-colored interference fringes provided on the reference mark member 41 by the two-colored illumination light beams having the different wavelengths $\lambda_1$ and $\lambda_2$ are aligned with each other with accuracy. That is, by the above calibration, the phase difference between the two-colored illumination light beams having the wavelengths $\lambda_1$ and $\lambda_2$ falls within a permissible range, and thereby enabling signals the contrast of which is good to be obtained when performing the final alignment. Next, the two-colored illumination light beams are emitted gain, a phase difference $\Delta\phi_0$ between the two beat signals obtained from the reticle 4 and the reference mark member 41 is measured.

Next, the second step for exposure of the wafer 6 will be explained. The wafer 6 is transferred onto the wafer stage 61 by the wafer auto-loader (not shown). The shot area 47 (see FIG. 4) of wafer 6 is positioned at an exposure position under the exposure optical system 5 with accuracy of better than ±¼ of the pitch $P_W$ of the wafer marks 48A and 49A on the basis of a measured result by a wafer pre-alignment system (not shown). After positioning thereof, the reticle mark 35A and the wafer mark 48A is illuminated by the alignment illumination light emitted from the alignment light sending system 1a, thereby performing final alignment (or fine alignment) between the reticle 4 and the shot are 47 of the wafer 6.

In this fine alignment, the reticle stage 9 or the wafer stage 61 is controlled, so that a phase difference between the reticle beat signal $S_R$ and the wafer beat signal $S_w$ coincides with the phase difference $\Delta\phi_0$ measured in final portion of the first step. When the positions of the reticle 4 and the wafer 6 relative to each other are aligned and the accomplishment of the alignment therebetween is transferred to the central control system 64 through the alignment signal processing system, exposure light is emitted to thereby transfer the pattern image on the reticle 4 to the shot area 47. Thus, each of the shot areas on the wafer 6 is sequentially exposed. When exposure of all shot areas are finished, the exposed wafer 6 is replaced with a new wafer, and alignment and exposure for the new wafer is carried out in the same way as for the wafer 6.

As mentioned above, in the embodiment, when performing alignment, the reticle marks on the reticle 4 are illuminated with only the illumination light of the wavelength $\lambda_1$. Generally, silica glass is coated with chrome film and the reticle marks are formed on the chrome film by patterning. Thus, it appears that the reticle marks are ideally made in comparison with the wafer marks. Therefore it is not necessary to use two-colored illumination light beams in order to perform alignment. The embodiment is that uses the above idea very well. Since the reticle beat signal $S_R$ is formed from only the illumination light of the wavelength $\lambda_1$, even if the direct-vision prism 25 (see FIG. 6) is rotated, the reticle beat signal $S_R$ in stable condition can be obtained constantly.

In order to decrease influence of the thin film interference and the like, the two-colored illumination light beams having the wavelengths $\lambda_1$ and $\lambda_2$ are used for the wafer mark 48A. In this case, in order to align the two-colored interference fringes of the wavelengths $\lambda_1$ and $\lambda_2$ with each other, which are formed by the two-colored illumination light beams, with reference to the reticle beat signal $S_R$, the laser beam source 11 emits the laser beam of the wavelength $\lambda_1$ with low power, thereby enabling deviation between the two-colored interference fringes of the two wavelengths to be eliminated.

In the above embodiment, a laser diode as the first laser beam source 11 and a He-Ne laser beam source 12 as the second laser beam source are employed. Thus, a shutter for blocking a laser beam may be employed to shut off the second laser beam source. In a case where two laser diodes are used as the first and second laser beam sources, all that is needed to shut off the second laser beam source is to turn off the power therefor. In order to decrease the output of the laser diode to for example one-tenth of the original output thereof, it is necessary only to control the electric power thereof. In order to decrease the output of a gas laser such as the He-Ne laser to for example one-tenth of the original output thereof, it is desirable to use a filter having transmittance of one-tenth.

In this embodiment, though the two-colored illumination light of the wavelengths $\lambda_1$ and $\lambda_2$ is used as the illumination light for alignment, illumination light having colors more than or equal to three colors may be used. In this embodiment, though the direct-vision prism 25 for adjusting interference fringes is used, a diffraction grating can be employed to bring about the same function as the direct-vision prism.

A second embodiment according to the present invention will be explained with reference to FIGS. 13 to 16. In the second embodiment, elements which are identical to those shown in the first embodiment have been given the same reference numerals, and explanation of the same elements is omitted. The following is explanation of points of the second embodiment generally different from the first embodiment.

Figure 13A:
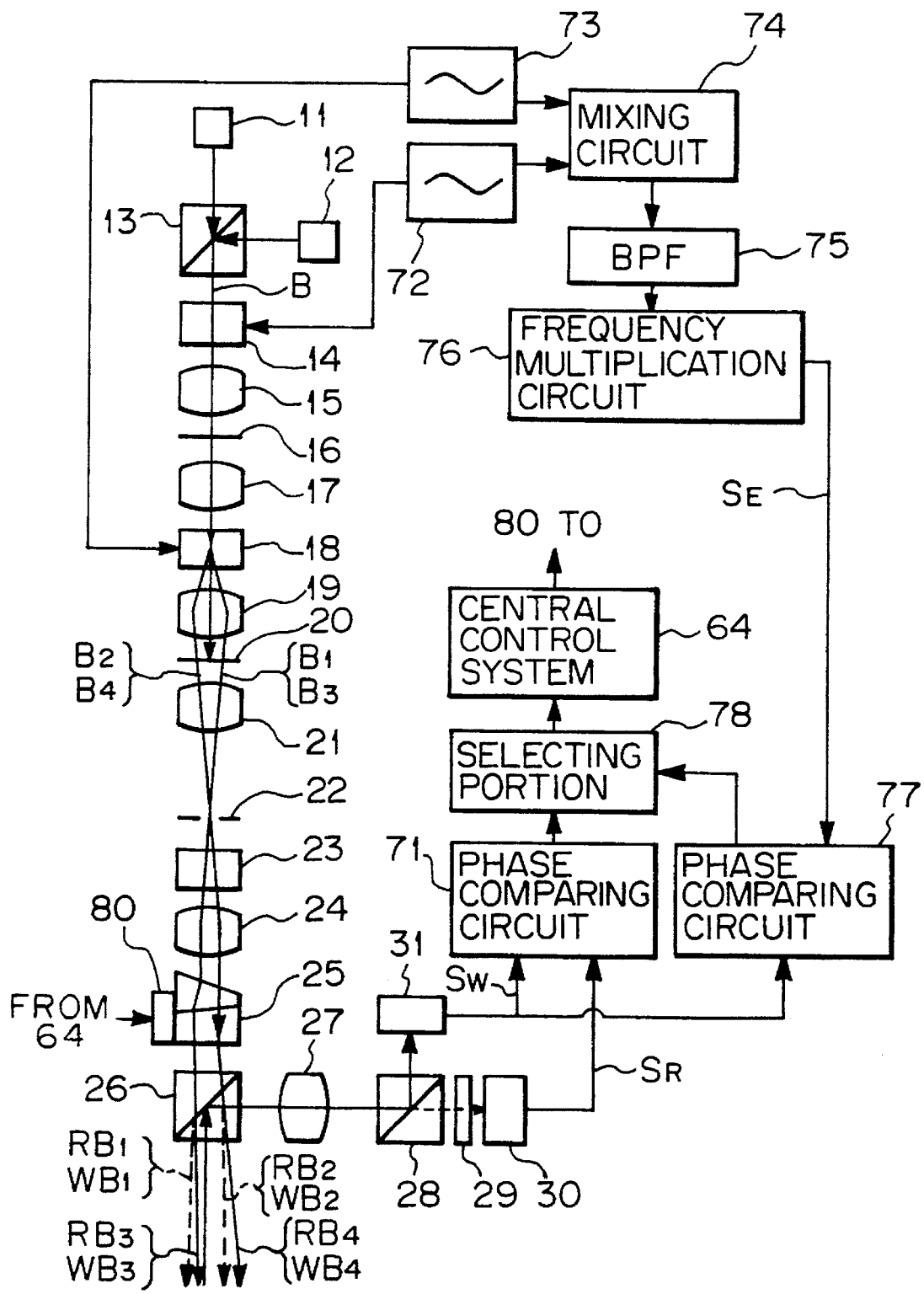
FIG. 13(a) is a front view of a block diagram schematically showing the arrangement of an alignment optical system according to the second embodiment of the present invention.
Figure 13B:
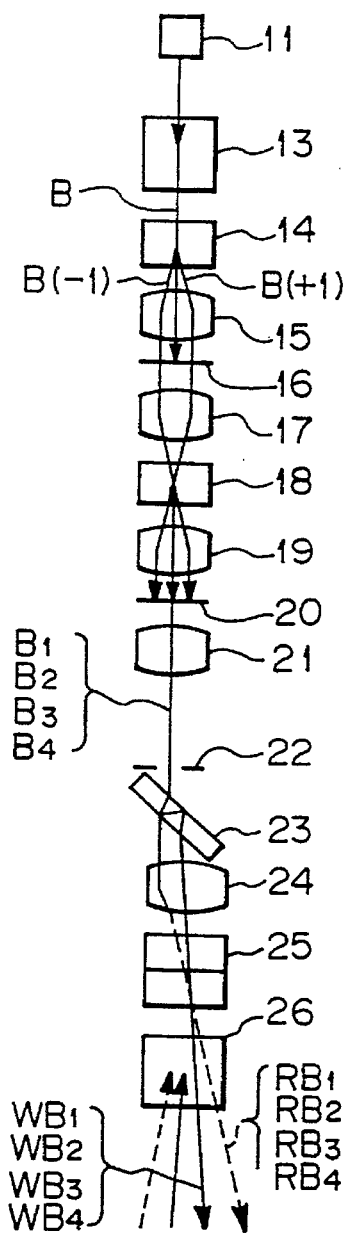
FIG. 13(b) is a side view of the alignment optical system shown in FIG. 13(a).
Figure 13C:
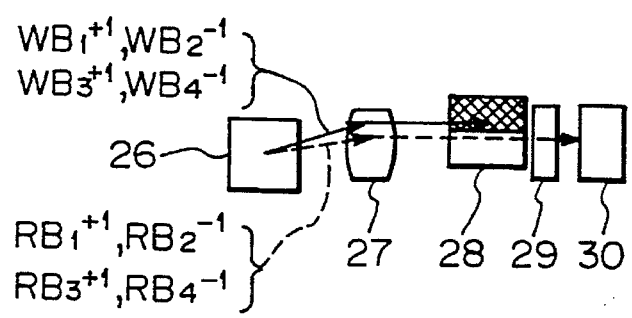
FIG. 13(c) is a bottom view of the alignment optical system shown in FIG. 13(a).

As shown in FIG. 13, an alignment apparatus according to the second embodiment further includes a phase comparing circuit 71, an AOM driver 72, an AOM driver 73, a mixing circuit 74, a BPF (band-pass filter) 75, a frequency multiplication circuit 76, a phase comparing circuit 77, and a selecting portion 78.

The reticle beat signal $S_R$ and the wafer beat signal $S_W$ are sent to the phase comparing circuit 71 in which a phase difference between both the signals is detected.

The AOM 14 is driven by a drive signal of frequency $F_1$ which is supplied from the AOM driver 72. The AOM 18 is driven by a drive signal of frequency $F_2$ which is supplied from the AOM driver 73. The drive signals respectively branch off in the AOM drivers 72 and 73 to be sent to the mixing circuit 74. The mixing circuit 74 mixes the drive signals of the frequencies $F_1$ and $F_2$ to produce electric signals having various frequencies such as a frequency of the difference between the two frequencies $(F_1-F_2)$, a frequency of the sum of the two frequencies $(F_1+F_2)$, and so on. The electric signals are supplied to the BPF 75 in which only an electric signal having the frequency of the difference between the two frequencies $(F_1-F_2)$ is obtained. The electric signal of the frequency $(F_1-F_2)$ is supplied to the frequency multiplication circuit 76 in which it is converted into an electric reference signal $S_E$ having a frequency of 2 $(F_1-F_2)$ obtained by doubling the frequency of the input signal.

When adjusting interference fringes formed on the reference diffraction grating mark 45A (see FIG. 5) by the two-colored illumination light having difference wavelengths, the electric reference signal $S_E$ having the frequency of 2 $(F_1-F_2)$ is sent to the phase comparing circuit 77 in which the electric reference signal $S_E$ and the wafer beat signal $S_W$ are compared in phase. The compared result is supplied to the selection portion 78. The phase difference between the reticle beat signal $S_R$ and the wafer beat signal $S_W$ is also supplied from the phase comparing circuit 71 to the selection portion 78. The selection portion 78 supplies either of the two phase differences to the central control system 64. On the basis of the detected phase difference, the central control system 64 determines a target phase difference or carries out the final alignment. In this second embodiment, the phase comparing circuit 71, the mixing circuit 74, the BPF 75, the frequency multiplication circuit 76, the phase comparing circuit 77, and a selecting portion 78 are provided in the alignment signal processing system 70 shown in FIG. 1. The AOM drivers 72 and 73 are provided in the laser control system 69 shown in FIG. 1.

As stated above, in the second embodiment, a reference signal generation system is provided which comprises the AOM drivers 72 and 73 for electrically driving the AOM 14 and the AOM 18, the mixing circuit 74, the BPF 75, and the frequency multiplication circuit 76. The reference signal generation system produces the electrical reference signal $S_E$ of a frequency which is identical to each of a frequency difference between a pair of the illumination light beams for illuminating the reticle marks and a frequency difference between a pair of the illumination light beams for illuminating the wafer marks. By detecting a phase difference between the electrical reference signal $S_E$ and the wafer beat signal $S_W$ when performing the calibration process followed by the exposure process, adjustment of deviation between the two-colored interference fringes produced on the reference diffraction grating mark 45A of the wafer 6 by the two-colored illumination light having the difference wavelengths $\lambda_1$ and $\lambda_2$ can be carried out without using the reticle beat signal $S_R$.

Next, the operation of the alignment according to the second embodiment will be explained.

First, calibration of the alignment optical system 1 as the first step is carried out.

In the calibration process, pre-alignment (or coarse adjustment) is performed in the same way as in the first embodiment, before carrying out a first fine alignment step and a second fine alignment step.

In the first fine alignment step, in line with instructions from the central control system 64, the laser control system 69 shuts off (or stops the operation of) the second laser beam source 12 emitting the laser beam of the wavelength $\lambda_2$ shown in FIGS. 13(a) and 13(b). The phase comparing circuit 77 shown in FIG. 13(a) then detects a phase difference between the wafer beat signal $S_W$ and the electric reference signal $S_E$.

Figure 14:
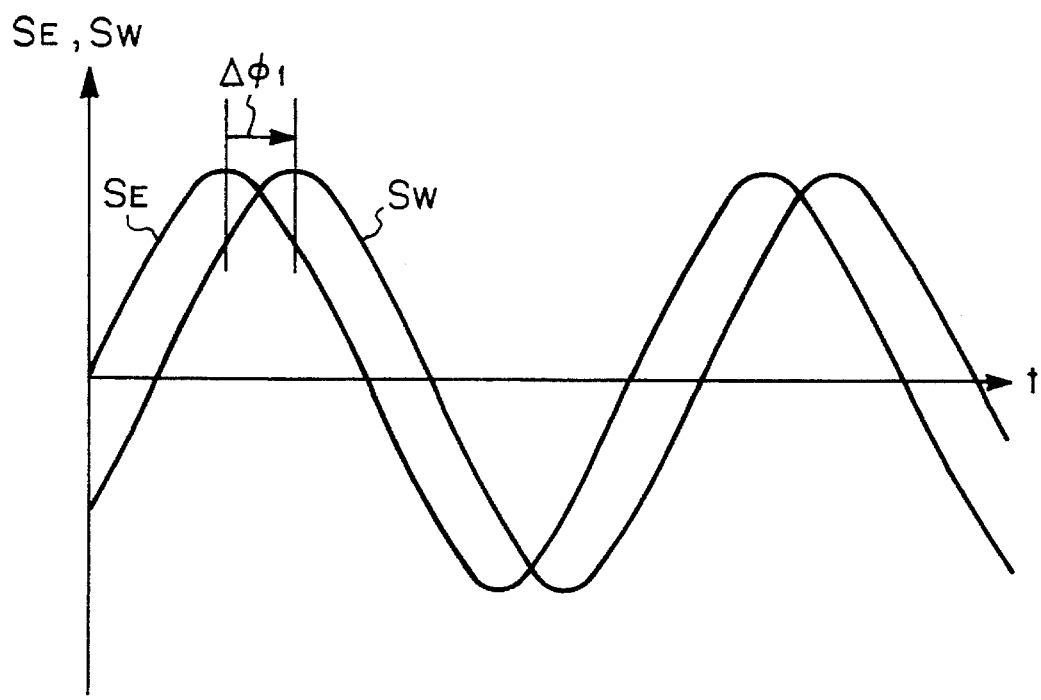
FIG. 14 is a waveform chart showing the phase relationship between an electrical reference signal and a wafer beat signal which are obtained when emitting alignment light of a first wavelength in an alignment system of a heterodyne interference method according to the second embodiment.

FIG. 14 shows the electric reference signal $S_E$ and the wafer beat signal $S_W$ corresponding to the reference diffraction grating mark 45A. The electric reference signal $S_E$ and the wafer beat signal $S_W$ are supplied to the phase comparing circuit 77 as alignment signals in the first fine adjustment step. In FIG. 14, a horizontal axis shows time (t), and a vertical axis shows signals $S_E$ and $S_W$. In this case, the phase comparing circuit 77 determines a phase difference $\Delta\phi_1$ between the electrical reference signal $S_E$ and the wafer beat signals $S_W$. The determined phase difference value is supplied to the central control system 64 through the selecting portion 78. It is preferable that the phase difference $\Delta\phi_1$ is close to zero (0). However, it is not always necessary for the phase difference $\Delta\phi_1$ to be zero.

Next, in the second fine adjustment step, in line with the instructions from the central control system 64, the laser control system 69 turns on (or works) the second laser beam source 12 shown in FIG. 13(a), and turns off (or stops the operation of) the first laser beam source 11 emitting the laser beam of the wavelength $\lambda_1$.

Figure 15:
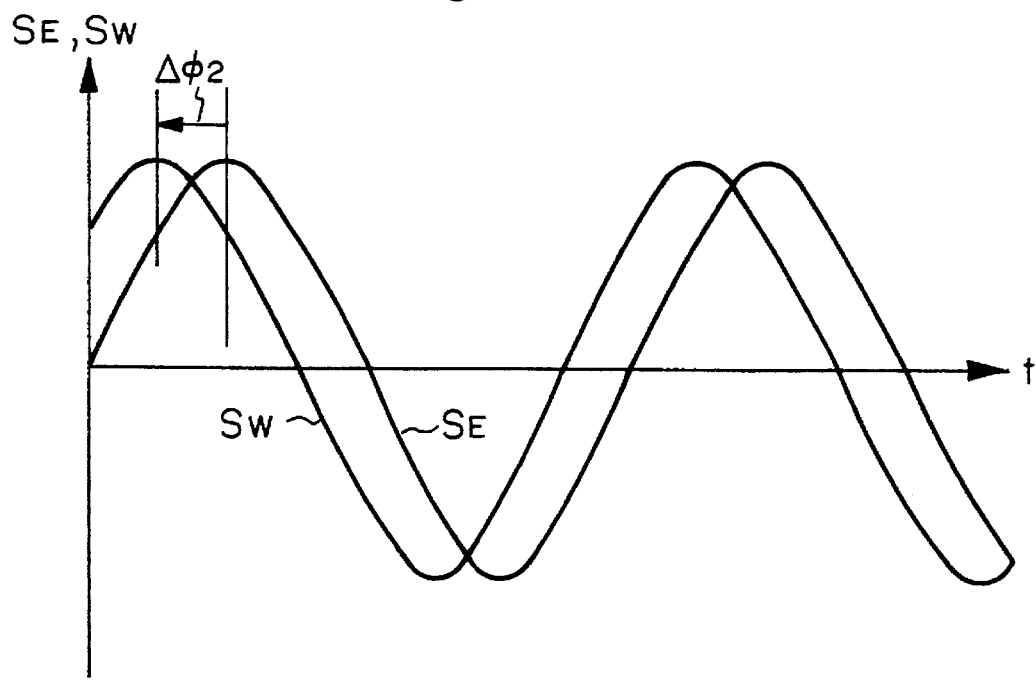
FIG. 15 is a waveform chart showing the phase relationship between an electrical reference signal and a wafer beat signal which are obtained when emitting alignment light of a second wavelength in an alignment system of a heterodyne interference method according to the second embodiment.

FIG. 15 shows the electrical reference signal $S_E$ and the wafer beat signal $S_W$ obtained through the second fine adjustment step in the same way as FIG. 14. From the result indicated by FIG. 15, the phase comparing circuit 77 determines the phase difference $\Delta\phi_2$ between the electrical reference signal $S_E$ and the wafer beat signal $S_W$. The result determined therein is supplied to the central control system 64 through the selecting portion 78. The central control system 64 computes the relative difference $\Delta\phi$ (=$\Delta\phi_1-\Delta\phi_2$). Making the relative difference $\Delta\phi$ zero is advantageous. However, it is permissible if the relative difference $\Delta\phi$ is within a predetermined value. If the relative difference $\Delta\phi$ is over the permissible level, in line with the instructions of the central control system 64, the rotation angle of the direct-vision prism 25 provided in the alignment light sending system 1a is adjusted according to the relative difference $\Delta\phi$ through the motor 80 shown in FIG. 13(a). After that, the phase differences $\lambda_1$ and $\lambda_2$ are measured again by the same way, and the same operation is repeated until the relative difference $\Delta\phi$ is within the permissible level. The permissible level of the relative difference $\Delta\phi$ depends on alignment accuracy to be required.

Figure 16:
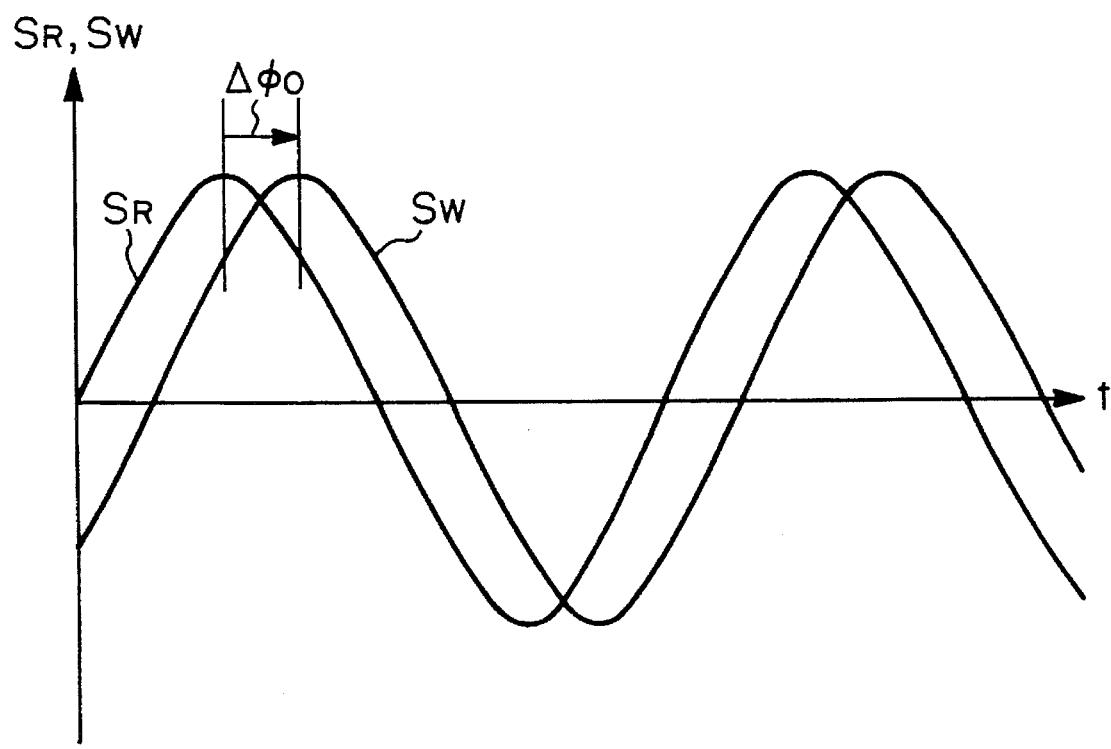
FIG. 16 is a waveform chart showing the phase relationship between a wafer beat signal and a reticle beat signal which are obtained when two-colored alignment light beams illuminates a wafer mark in an alignment system of a heterodyne interference method according to the second embodiment.

By the above process, the two-colored interference fringes provided on the reference mark member 41 by the two-colored illumination light beams having the different wavelengths $\lambda_1$ and $\lambda_2$ are aligned with each other with accuracy. That is, the phase difference between the two-colored illumination light beams having the wavelengths $\lambda_1$ and $\lambda_2$ falls within permissible range by the calibration, and thereby signal the contrast of which is good can be obtained when performing the final alignment. Next, the two-colored illumination light beams are emitted gain, and the reticle beat signal $S_R$ obtained from the reticle 4 and the wafer beat signal $S_W$ obtained from the reference mark member 41 are detected. One example each of the two signals is shown in FIG. 16. The reticle beat signal $S_R$ and the wafer beat signal $S_W$ are supplied to the phase comparing circuit 71. The phase comparing circuit 71 detects a phase difference $\Delta\phi_0$ between the two beat signals $S_R$ and $S_W$, and supplies the detected result to the central control system 64 through the selecting portion 78.

Next, the second step for exposure of the wafer 6 is carried out. In FIG. 1, the wafer 6 is transferred onto the wafer stage 61 by the wafer auto-loader (not shown). The shot area 47 (see FIG. 4) of wafer 6 is positioned at an exposure position under the exposure optical system 5 with accuracy of within ±¼ of the pitch $P_W$ of the wafer marks 48A and 49A on the basis of a value measured by a wafer pre-alignment system (not shown). After positioning of the shot area 47 of wafer 6 at the exposure position, the reticle mark 35A and the wafer mark 48A is illuminated with the alignment illumination light emitted from the alignment light sending system 1a, thereby performing final alignment (or fine alignment) between the reticle 4 and the shot are 47 of the wafer 6.

In this fine alignment, the central control system 64 controls the reticle stage 9 or the wafer stage 61, so that a phase difference between the reticle beat signal $S_R$ and the wafer beat signal $S_W$ coincides with the phase difference $\Delta\phi_0$ measured in final portion of the second fine adjustment step. When the positions of the reticle 4 and the wafer 6 relative to each other is aligned and the accomplishment of the alignment therebetween is determined by the central control system 64, exposure light is emitted to thereby transfer the pattern image on the reticle 4 to the shot area 47. Thus, each of the shot areas on the wafer 6 is sequentially exposed. When exposure of all shot areas on the wafer 6 are finished, the exposed wafer 6 is replaced with a new wafer, and alignment and exposure for the new wafer is carried out in the same way as for the wafer 6.

In the first and second fine adjustment steps, the laser beam source 11 of the wavelength $\lambda_1$ and the laser beam source 12 of the wavelength $\lambda_2$ are alternately shut off. The output or power of the laser beam sources 11 and 12 may be alternately decreased within a predetermined value.

Thus, in the second embodiment, the photoelectric detection element 30 receives the heterodyne beams having only the wavelength $\lambda_1$ from the reticle mark 35A of the reticle 4. That is, it results in the reticle mark being illuminated with only the illumination light of the wavelength $\lambda_1$. If the reticle mark 35A is observed with two-colored illumination light having the different wavelengths as the reference diffraction grating mark 45A of the wafer 6 is done, chromatic aberration of the projection optical system 5 causes deviation between two-colored interference fringes formed on the reticle mark 35A by the two-colored illumination light when deviation between two-colored interference fringes on the wafer 6 is adjusted. For example, in a case where the two-colored illumination light beams are identical in intensity thereof and one of the two-colored interference fringes is deviated in the phase thereof by a half pitch from the other colored interference fringe, the reticle beat signal disappears. In order to avoid such a happening, the reticle mark is observed only with the single-colored light beam.

When adjusting the deviation between the two-colored interference fringes having the different wavelengths, employment of the following processing causes disappearance of the reticle beat signal.

First, the one-colored illumination light and the other colored illumination light alternately illuminate the wafer 6. Then, the photoelectric detection element 31 receives the heterodyne beams comprising, for example, (±) primary diffracted light beams from the reference diffraction grating mark 45A to generate the wafer beat signal $S_W$. On the other hand, the photoelectric detection element 30 receives the heterodyne beams comprising, for example, (±) primary diffraction light beams from the reticle mark 35A to generate the reticle beat signal $S_R$. Next, comparison of phases of the two beat signals is performed. In such a processing, since the reticle mark 35A is not observed with the illumination light of the wavelength $\lambda_2$, adjustment of deviation between the two-colored interference fringes causes disappearance of the reticle beat signal $S_R$ not to compare a phase difference between the two beat signals $S_R$ and $S_W$.

As opposed to that, according to the second embodiment, the drive signals from the AOM drivers 72 and 73 for electrically driving the AOM 14 and the AOM 18 are processed to generates the electrical reference signal $S_E$ having the frequency which is identical to each of the frequency difference between a pair of the illumination light beams for illuminating the reticle 4 and the frequency difference between a pair of the illumination light beams for illuminating the wafer 6. A phase difference between the electrical reference signal $S_E$ and the wafer beat signal $S_W$ is detected. On the basis of the detected phase difference, the direct-vision prism 25 adjusts deviation between a position on the wafer 6 which the one-colored illumination light illuminates and a position on the wafer 6 which the other colored illumination light illuminates. That is, the electrical reference signal $S_E$ serves as a reference signal for adjusting the two-colored interference fringes having the wavelengths $\lambda_1$ and $\lambda_2$ produced on the reference diffraction grating mark 45A, thereby enabling the adjustment of deviation between the two-colored interference fringes without producing the reticle beat signal $S_R$. Thus, when performing alignment, the illumination light of the wavelength $\lambda_1$ can be made zero or lowered in its intensity.

In the second embodiment, a frequency of the electrical reference signal $S_E$ is identical to that of the wafer beat signal $S_W$. However, for example, a frequency of the electrical reference signal $S_E$ may be 1/N (N is an integral more than or equal to 2) of that of the wafer beat signal $S_W$. In this case, a phase difference therebetween can be determined. Similarly, when a phase difference between the electrical reference signal $S_E$ and the wafer beat signal $S_W$ is within a predetermined range, a frequency of the electrical reference signal $S_E$ may be increased by N times of that of the wafer beat signal $S_W$.

In the second embodiment, though the two-colored illumination light of the wavelengths $\lambda_1$ and $\lambda_2$ is used as illumination light for alignment, illumination light having colors more than or equal to three may be used. Additionally, in the second embodiment, though the direct-vision prism 25 is used for adjusting the interference fringes, a diffraction grating may employed in place of the direct-vision prism 25. The employment of a diffraction grating can bring about the same technical advantage as that of the direct-vision prism 25. In the second embodiment, the present invention is applied to an alignment apparatus of a TTR type. In addition to that, the present invention can be applied to an alignment apparatus of a multicolored heterodyne interference method with a TTL (Through-The-Lens) type or an off-axis type.

According to the alignment apparatus of the present invention, when detecting a position of a substrate through a projection optical system by using illumination light having two wavelengths, since positions to be illuminated with light beams having first and second wavelengths are adjusted on the basis of both a phase difference between two beat signals which are obtained by the light beams of the second wavelength being decreased in their intensity and a phase difference between two beat signals which are obtained by decreasing the intensity of the light beams of the first wavelength to the extent that heterodyne beams can be detected, an amount of deviation between an interference fringe formed on the mark on the substrate by the one-colored light beams and an interference fringe formed on the mark thereon by the other colored light beams can be decreased. This allows alignment to be carried out with accuracy, even if reflectance of the substrate can be greatly changed depending on wavelength. Employment of single-colored alignment light beams for a reference grating prevents contrast of the beat signal (or the reticle beat signal) with respect to the reference grating from being lowered and disappearing, when a position on the substrate which the one-colored alignment light beams illuminate is aligned with a position on the substrate which the other colored alignment light beams illuminate.

In a case where the reference grating is formed on the mask and the reference grating is composed of a diffraction grating-shaped mark, it is not necessary to employ an additional element for providing the reference grating thereon, and an amount of positional deviation between the mask and the substrate can be directly detected.

In a case where an illumination light controlling element for controlling chromatic aberration of the projection optical system relative to the light beams of the first wavelength so that the chromatic aberration thereof becomes a predetermined value is provided in an area on a Fourier transform plane relative to the mask in the projection optical system or a plane adjacent to the Fourier transform plane through which the light beams of the first wavelength pass, and where another illumination light controlling element for controlling chromatic aberration of the projection optical system relative to the light beams of the second wavelength so that the chromatic aberration thereof becomes a predetermined value is provided in an area on a Fourier transform plane relative to the mask in the projection optical system or a plane adjacent to the Fourier transform plane through which the light beams of the second wavelength pass, since the mask is easily conjugate with the substrate with respect to the alignment light, an optical system for the mask and the substrate can be shared, thereby enabling alignment to be performed with a TTR system.

According to the alignment apparatus of the present invention, since a phase difference between a reference signal and a beat signal is detected and alignment is performed on the basis of the detected result, when detecting a position of a substrate by using illumination light having two wavelengths, an amount of deviation between two-colored interference fringes on diffraction grating-shaped mark produced by two-colored light beams can be adjusted with high accuracy. Thus, this allows alignment to be carried out with accuracy, even if reflectance of the substrate can be greatly changed depending on a wavelength.

In the alignment apparatus of the present invention, in a case where a heterodyne beam generating system generates the first and second pairs of light beams by a acousto-optic modulator driven by a drive signal having a predetermined frequency difference, and where a reference signal generating device generates a reference signal (or an electrical reference signal) on the basis of the drive signal, a frequency of a beat signal (or a wafer beat signal) from a photoelectric detection device can be in integral multiple relation to that of the reference signal to easily and precisely detect a phase difference between the beat signal and the reference signal to align two-colored interference fringes with each other with high accuracy.

In a case where the alignment apparatus of the present invention is provided on a projection exposure apparatus for transferring through a projection optical system a transferring pattern on a mask (or a reticle) onto a photosensitive substrate (or a wafer), where an illumination optical system illuminates a diffraction grating-shaped mark on the substrate with the first and second pairs of light beams through the projection optical system, and where the photoelectric detection device receives heterodyne beams generated by diffraction of the light beams by the diffraction grating-shaped mark through the projection optical system, a TTL type can be employed in order to align interference fringes on the substrate produced by the two-colored light beams with high accuracy.

According to the alignment apparatus of the present invention, since a third pair of light beams having a first wavelength and a fourth pair of light beams having a second wavelength are employed, alignment between the mask and the substrate can be performed with high accuracy without receiving the influence of thin film interference and the like on the substrate.

In addition, since deviation between an interference fringe on the substrate provided by a pair of light beams of the first wavelength and another interference fringe on the substrate provided by a pair of light beams of the second wavelength is adjusted by a reference signal having a frequency corresponding to each of a frequency difference 5 between the third light beams and a frequency difference between the fourth light beams, the adjustment of deviation between the two-colored interference fringes can be performed without receiving any optical influence.

Additionally, in a case where a first illumination optical system illuminates the mask mark only with the first pair of light beams, it results in the mask mark being observed only with the single-colored light beam. This can prevent contrast of the beat signal (or the reticle beat signal) with respect to the mask mark from being lowered and disappearing, when positions on the substrate which the two-colored alignment light beams illuminate are appropriately aligned with each other.

According to the alignment apparatus of the present invention, in a case where the heterodyne beam generating system generates the first and second pairs of light beams by the acousto-optic modulator driven by the drive signal having a predetermined frequency difference, and where the reference signal generating device generates the reference signal on the basis of the drive signal, a phase difference between the beat signal and the reference signal can be easily and precisely detected, thereby enabling the two-colored interference fringes to be aligned with each other with high accuracy.

Thus, the present invention is not necessarily limited to the foregoing embodiments, various changes and modifications can be imparted thereto without departing from the gist of the present invention.

What is claimed is:

1. An alignment apparatus adapted to be provided on a projection exposure apparatus for projecting through a projection optical system a transferring pattern on a mask onto a photosensitive substrate rested on a two-dimensionally movable stage and for detecting a position of the substrate on the basis of a diffraction grating-shaped mark formed on the substrate comprising:

a reference optical member;

a first illumination optical system for illuminating said reference optical member with a first pair of light beams having different frequencies and a first wavelength;

a first photoelectric detection device for photoelectrically transforming a first heterodyne beam generated by diffraction of the first light beams by said reference optical member into a first beat signal;

a second illumination optical system for illuminating said diffraction grating-shaped mark through said projection optical system with a second pair of light beams having different frequencies and the first wavelength;

a third illumination optical system for illuminating said diffraction grating-shaped mark through said projection optical system with a third pair of light beams having different frequencies and a second wavelength different from the first wavelength;

a second photoelectric detection device for photoelectrically transforming second and third heterodyne beams respectively generated by diffraction of the second and third light beams by said diffraction grating-shaped mark into a second beat signal, said second heterodyne beam having the first wavelength, said third heterodyne beam having the second wavelength, said second and third heterodyne beams being returned through said projection optical system;

a phase comparing device for detecting a phase difference between said first and second beat signals;

a relative position adjusting device for adjusting a relative position in a diffraction grating-shaped mark measuring direction between a position on said diffraction grating-shaped mark illuminated by said second light beams and that thereon illuminated by said third light beams; and a control device for controlling said relative position adjusting device on the basis of a first phase difference detected by said phase comparing device when light intensity of said third light beams on said substrate is decreased below a predetermined level and a second phase difference detected by said phase comparing device when light intensity of said first light beams on said reference optical member is decreased within the range in which said second heterodyne beam can be detected.

2. An exposure apparatus according to claim 1, wherein said reference optical member is formed on said mask, and wherein said reference optical member includes a diffraction grating-shaped mark.

3. An exposure apparatus according to any one of claims 1 and 2, wherein an illumination light controlling element for controlling chromatic aberration of said projection optical system relative to said light beams of the first wavelength so that the chromatic aberration thereof becomes a predetermined value is provided in an area on one of a Fourier transform plane relative to the mask in the projection optical system and a plane adjacent to the Fourier transform plane through which said light beams of the first wavelength pass, and wherein another illumination light controlling element for controlling chromatic aberration of said projection optical system relative to said light beams of the second wavelength so that the chromatic aberration thereof becomes a predetermined value is provided in an area on one of a Fourier transform plane relative to the mask in the projection optical system and a plane adjacent to the Fourier transform plane through which said light beams of the second wavelength pass.

4. An alignment apparatus for detecting a position of a photosensitive substrate on the basis of a diffraction grating-shaped mark formed on the substrate comprising:

an illumination optical system for illuminating said diffraction grating-shaped mark with a first pair of light beams having different frequencies and a first wavelength and a second pair of light beams having different frequencies and a second wavelength different from the first wavelength;

a photoelectric detection device for photoelectrically transforming a first heterodyne beam having the first wavelength generated by diffraction of the first light beams by said diffraction grating-shaped mark and a second heterodyne beam having the second wavelength generated by diffraction of the second light beams by said diffraction grating-shaped mark into a beat signal;

a reference signal generating device for electrically generating a reference signal having a frequency corresponding to each of a frequency difference between said first light beams and a frequency difference between said second light beams;

a phase comparing device for detecting a phase difference between said reference signal generated from said reference signal generating device and said beat signal supplied from said photoelectric detection device;

a relative position adjusting device for adjusting a relative position in a diffraction grating-shaped mark measuring direction between a position on said diffraction grating-shaped mark illuminated by said first light beams and that thereon illuminated by said second light beams; and a control device for controlling said relative position adjusting device on the basis of a first phase difference detected by said phase comparing device when light intensity of said first light beams on said substrate is decreased below a predetermined level and a second phase difference detected by said phase comparing device when light intensity of said second light beams on said substrate is decreased below a predetermined level.

5. An alignment apparatus according to claim 4, wherein said illumination optical system comprises a heterodyne beam generating system including an acousto-optic modulator driven by a drive signal having a predetermined frequency difference, wherein said acousto-optic modulator generates said first and second pairs of light beams, and wherein said reference signal generating device generates said reference signal on the basis of said drive signal.

6. An alignment apparatus according to claim 4, wherein said alignment apparatus is provided on a projection exposure apparatus for transferring through a projection optical system a transferring pattern on a mask onto a photosensitive substrate, wherein said illumination optical system illuminates said diffraction grating-shaped mark formed on the substrate with said first and second pairs of light beams through said projection optical system, and wherein said photoelectric detection device receives said heterodyne beams generated by diffraction of said light beams by said diffraction grating-shaped mark through said projection optical system.

7. An alignment apparatus adapted to be provided on a projection exposure apparatus for projecting a transferring pattern image of a mask through a projection optical system onto a photosensitive substrate rested on a two-dimensionally movable stage and for performing an alignment between said mask and said substrate on the basis of a diffraction grating-shaped mask mark formed on said mask and a diffraction grating-shaped substrate mark formed on said substrate comprising:

a first illumination optical system for illuminating the mask mark with at least one of a first pair of light beams having different frequencies and a first wavelength and a second pair of light beams having different frequencies and a second wavelength different from the first wavelength;

a second illumination optical system for allowing said first light beams to pass through said projection optical system to generate a third pair of light beams having different frequencies and said first wavelength and allowing said second light beams to pass through said projection optical system to generate a fourth pair of light beams having different frequencies and said second wavelength to illuminate said substrate mark with said third and fourth light beams;

a second photoelectric detection device for photoelectrically transforming third and fourth heterodyne beams respectively generated by diffraction of the third and fourth light beams by said substrate mark into a beat signal, said third heterodyne beams having said first wavelength, said fourth heterodyne beams having said second wavelength, said third and fourth heterodyne beams being respectively returned through said projection optical system;

a reference signal generating device for electrically generating a reference signal having a frequency corresponding to each of a frequency difference between said first light beams and a frequency difference between said second light beams;

a phase comparing device for detecting a phase difference between said reference signal generated from said reference signal generating device and said beat signal generated from said second photoelectric detection device;

a relative position adjusting device for adjusting a relative position in a substrate mark measuring direction between a position on said substrate illuminated by said third light beams and that thereon illuminated by said fourth light beams; and a control device for controlling said relative position adjusting device on the basis of a first phase difference detected by said phase comparing device when light intensity of said third light beams on said substrate is decreased below a predetermined level and a second phase difference detected by said phase comparing device when light intensity of said fourth light beams on said substrate is decreased below another predetermined level.

8. An alignment apparatus according to claim 7, wherein said first illumination optical system illuminates said mask mark only with said first light beams.

9. An alignment apparatus according to claim 7, wherein said first illumination optical system comprises a heterodyne beam generating system for generating said first and second light beams, wherein said heterodyne beam generating system includes an acousto-optic modulator which is driven by a drive signal having a predetermined frequency difference to generate said first and second light beams, and wherein said reference signal generating device generates said reference signal on the basis of said drive signal.

10. An alignment apparatus according to claim 7, further comprising a first photoelectric detection device for photoelectrically transforming a heterodyne beam generated by diffraction of one of said first and second light beams by said mask mark into a beat signal, a phase difference comparing device for detecting a phase difference between said beat signal generated from said first photoelectric detection device and said beat signal generated from said second photoelectric detection device, and a control device for controlling a relative position between said mask and said stage on the basis of the phase difference.

11. An alignment apparatus for detecting a position of a photosensitive substrate on the basis of a diffraction grating-shaped mark formed on the substrate comprising:

- an illumination optical system for illuminating said diffraction grating-shaped mark with a first pair of light beams having different frequencies and a first wavelength and a second pair of light beams having different frequencies and a second wavelength different from the first wavelength;
- a photoelectric detection device for photoelectrically transforming a first heterodyne beam having the first wavelength generated by diffraction of the first light beams by said diffraction grating-shaped mark and a second heterodyne beam having the second wavelength generated by diffraction of the second light beams by said diffraction grating-shaped mark into a beat signal;
- a phase comparing device for detecting a phase difference between a predetermined reference signal and said beat signal supplied from said photoelectric detection device;
- a relative position adjusting device for adjusting a relative position in a diffraction grating-shaped mark measuring direction between a position on said diffraction grating-shaped mark illuminated by said first light beams and that thereon illuminated by said second light beams; and
- a control device for controlling said relative position adjusting device on the basis of a first phase difference detected by said phase comparing device when light intensity of said first light beams on said substrate is decreased below a predetermined level and a second phase difference detected by said phase comparing device when light intensity of said second light beams on said substrate is decreased below a predetermined level.

12. A method for detecting a position of a substrate onto which a transferring pattern on a mask is projected through a projection optical system on the basis of a diffraction grating-shaped mark formed on the substrate comprising:

- providing a reference optical member;
- illuminating said reference optical member with a first pair of light beams having different frequencies and a first wavelength;
- photoelectrically transforming a first heterodyne beam generated by diffraction of the first light beams by said reference optical member into a first beat signal;
- illuminating said diffraction grating-shaped mark through said projection optical system with a second pair of light beams having different frequencies and the first wavelength;
- illuminating said diffraction grating-shaped mark through said projection optical system with a third pair of light beams having different frequencies and a second wavelength different from the first wavelength;
- photoelectrically transforming second and third heterodyne beams respectively generated by diffraction of the second and third light beams by said diffraction grating-shaped mark into a second beat signal, said second and heterodyne beam having the first wavelength, said third heterodyne beam having the second wavelength, said second and third heterodyne beams being returned through said projection optical system;
- detecting a phase difference between said first and second beat signals;
- adjusting a relative position in a diffraction grating-shaped mark measuring direction between a position on said diffraction grating-shaped mark illuminated by said second light beams and that thereon illuminated by said third light beams; and
- controlling said relative position on the basis of a first phase difference detected when light intensity of said third light beams on said substrate is decreased below a predetermined level and a second phase difference detected when light intensity of said first light beams on said reference optical member is decreased within the range in which said second heterodyne beam can be detected.

13. A method for detecting a position of a photosensitive substrate on the basis of a diffraction grating-shaped mark formed on the substrate comprising:

- illuminating said diffraction grating-shaped mark with a first pair of light beams having different frequencies and a first wavelength and a second pair of light beams having different frequencies and a second wavelength different from the first wavelength;
- photoelectrically transforming a first heterodyne beam having the first wavelength generated by diffraction of the first light beams by said diffraction grating-shaped mark and a second heterodyne beam having the second wavelength generated by diffraction of the second light beams by said diffraction grating-shaped mark into a beat signal;
- electrically generating a reference signal having a frequency corresponding to each of a frequency difference between said first light beams and a frequency difference between said second light beams;
- detecting a phase difference between said reference signal and said beat signal;
- adjusting a relative position in a diffraction grating-shaped mark measuring direction between a position on said diffraction grating-shaped mark illuminated by said first light beams and that thereon illuminated by said second light beams; and
- controlling said relative position on the basis of a first phase difference detected when light intensity of said first light beams on said substrate is decreased below a predetermined level and a second phase difference detected when light intensity of said second light beams on said substrate is decreased below a predetermined level.

14. A method adapted to apply to a projection exposure apparatus for projecting a transferring pattern image of a mask through a projection optical system onto a photosensitive substrate rested on a two-dimensionally movable stage and for performing an alignment between said mask and said substrate on the basis of a diffraction grating-shaped mask mark formed on said mask and a diffraction grating-shaped substrate mark formed on said substrate comprising:

illuminating the mask mark with at least one of a first pair of light beams having different frequencies and a first wavelength and a second pair of light beams having different frequencies and a second wavelength different from the first wavelength;

allowing said first light beams to pass through said projection optical system to generate a third pair of light beams having different frequencies and said first wavelength and allowing said second light beams to pass through said projection optical system to generate a fourth pair of light beams having different frequencies and said second wavelength to illuminate said substrate mark with said third and fourth light beams;

photoelectrically transforming third and fourth heterodyne beams respectively generated by diffraction of the third and fourth light beams by said substrate mark into a beat signal, said third heterodyne beams having said first wavelength, said fourth heterodyne beams having said second wavelength, said third and fourth heterodyne beams being respectively returned through said projection optical system;

electrically generating a reference signal having a frequency corresponding to each of a frequency difference between said first light beams and a frequency difference between said second light beams;

detecting a phase difference between said reference signal and said beat signal;

adjusting a relative position in a substrate mark measuring direction between a position on said substrate illuminated by said third light beams and that thereon illuminated by said fourth light beams; and controlling said relative position on the basis of a first phase difference detected when light intensity of said third light beams on said substrate is decreased below a predetermined level and a second phase difference detected when light intensity of said fourth light beams on said substrate is decreased below another predetermined level.

15. A method for detecting a position of a photosensitive substrate on the basis of a diffraction grating-shaped mark formed on the substrate comprising:

illuminating said diffraction grating-shaped mark with a first pair of light beams having different frequencies and a first wavelength and a second pair of light beams having different frequencies and a second wavelength different from the first wavelength;

photoelectrically transforming a first heterodyne beam having the first wavelength generated by diffraction of the first light beams by said diffraction grating-shaped mark and a second heterodyne beam having the second wavelength generated by diffraction of the second light beams by said diffraction grating-shaped mark into a beat signal;

detecting a phase difference between a predetermined reference signal and said beat signal;

adjusting a relative position in a diffraction grating-shaped mark measuring direction between a position on said diffraction grating-shaped mark illuminated by said first light beams and that thereon illuminated by said second light beams; and controlling said relative position adjusting device on the basis of a first phase difference detected when light intensity of said first light beams on said substrate is decreased below a predetermined level and a second phase difference detected when light intensity of said second light beams on said substrate is decreased below a predetermined level.

* * * * *